United States Patent
Lu et al.

(10) Patent No.: US 9,954,020 B1
(45) Date of Patent: Apr. 24, 2018

(54) HIGH-DYNAMIC-RANGE COLOR IMAGE SENSORS AND ASSOCIATED METHODS

(71) Applicant: OmniVision Technologies, Inc., Santa Clara, CA (US)

(72) Inventors: Chen-Wei Lu, San Jose, CA (US); Dajiang Yang, San Jose, CA (US); Oray Orkun Cellek, Mountain View, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/395,963

(22) Filed: Dec. 30, 2016

(51) Int. Cl.
| | |
|---|---|
| *H01L 27/146* | (2006.01) |
| *H04N 9/04* | (2006.01) |
| *H04N 5/355* | (2011.01) |
| *H04N 5/369* | (2011.01) |
| *G02B 5/20* | (2006.01) |

(52) U.S. Cl.
CPC ........ *H01L 27/14621* (2013.01); *G02B 5/201* (2013.01); *G02B 5/205* (2013.01); *H01L 27/14607* (2013.01); *H01L 27/14685* (2013.01); *H04N 5/355* (2013.01); *H04N 5/3696* (2013.01); *H04N 9/045* (2013.01)

(58) Field of Classification Search
None
See application file for complete search history.

(56) References Cited

U.S. PATENT DOCUMENTS

| | | | |
|---|---|---|---|
| 7,667,749 B2 | 2/2010 | Han | |
| 2007/0035653 A1* | 2/2007 | Hong | ................ G06T 5/50 348/340 |
| 2007/0296843 A1* | 12/2007 | Kasuga | ............... H01L 27/1462 348/294 |
| 2013/0313411 A1* | 11/2013 | Ui | ...................... H04N 5/35545 250/208.1 |
| 2014/0253767 A1* | 9/2014 | Kato | ................ H01L 27/14625 348/280 |

* cited by examiner

*Primary Examiner* — Erik Kielin
(74) *Attorney, Agent, or Firm* — Lathrop Gage LLP

(57) ABSTRACT

A high-dynamic-range color image sensor includes (a) a silicon substrate having a photosensitive pixel array with a plurality of first pixels and a plurality of second pixels, (b) a color filter layer disposed on the silicon substrate and including at least (i) a plurality of first color filters positioned above a first subset of each of the plurality of first pixels and the plurality of second pixels and configured to selectively transmit light of a first color and (ii) a plurality of second color filters positioned above a second subset of each of the plurality of first pixels and the plurality of second pixels and configured to selectively transmit light of a second color, and (c) a dynamic-range extending layer disposed on the color filter layer and including grey filters disposed above the second plurality of pixels to attenuate light propagating toward the second plurality of pixels.

13 Claims, 13 Drawing Sheets

HIGH-DYNAMIC-RANGE COLOR IMAGE SENSORS AND ASSOCIATED METHODS

BACKGROUND

Standard image sensors have a limited dynamic range of about 60 to 70 dB or less. For example, an 8-bit sensor has a dynamic range of only 48 dB. However, the luminance dynamic range of the real world is much larger and natural scenes often span a range of 90 dB or more. When an image sensor captures a scene with a luminance dynamic range in excess of the sensor dynamic range, information is necessarily lost. Depending on the exposure settings, the brighter regions may be saturated and/or the dimmer regions may be underexposed, producing a captured image of a quality unable to reproduce the actual scene.

In order to simultaneously capture highlights and shadows of a scene, image sensors have used High Dynamic Range (HDR) technologies to increase the captured dynamic range. One of the most common techniques to increase the dynamic range is to merge multiple exposures, captured with a standard, low dynamic range image sensor, into a single HDR image that has a much larger dynamic range than a single exposure image. For instance, images of the same scene may be recorded at two different exposure times, where the longer exposure is set to optimally capture the dimmest portions of the scene and the shorter exposure is set to optimally capture the brightest portions of the scene. However, such image combination methods frequently suffer from artifacts caused, for example, by objects in the scene moving between exposures.

HDR image sensors that capture an HDR color image in a single frame have been developed. Such an HDR image sensor includes two interleaved pixel arrays, one pixel array with larger pixels and another pixel array with smaller pixels. The larger pixels are more light sensitive, thus optimal for capture of dim scenes or dim portions of a scene. The smaller pixels are less light sensitive, thus optimal for capture of bright scenes or the brighter portions of a scene.

SUMMARY

In an embodiment, a high-dynamic-range (HDR) color image sensor includes a silicon substrate having a photosensitive pixel array with a plurality of first pixels and a plurality of second pixels. The HDR color image sensor further includes a color filter layer disposed on the silicon substrate and having at least a plurality of first color filters and a plurality of second color filters. The first color filters are positioned above a first subset of each of the plurality of first pixels and the plurality of second pixels. The first color filters are configured to selectively transmit light of a first color range. The second color filters are positioned above a second subset of each of the plurality of first pixels and the plurality of second pixels. The second color filters are configured to selectively transmit light of a second color range. The HDR color image sensor also includes a dynamic-range extending layer disposed on the color filter layer. The dynamic-range extending layer includes grey filters disposed above the second plurality of pixels to attenuate light propagating toward the second plurality of pixels.

In an embodiment, a method for manufacturing a high-dynamic-range color image sensor includes depositing a color filter layer on a silicon substrate having a photosensitive pixel array with a plurality of first pixels and a plurality of second pixels. The step of depositing includes forming at least (a) a plurality of first color filters above a first subset of each of the plurality of first pixels and the plurality of second pixels and (b) a plurality of second color filters above a second subset of each of the plurality of first pixels and the plurality of second pixels. The thickness of the second color filters exceeds the thickness of the first color filters. The method further includes depositing, on the color filter layer, a dynamic-range extending layer including grey filters above the second pixels to attenuate light propagating toward the second pixels. The combined thickness of the color filter layer and the dynamic-range extending layer is uniform across the photosensitive pixel array, such that the thickness of the grey filters above the second color filters is less than the thickness of the grey filters above the first color filters to compensate for attenuation of material of the grey filters being greater in the transmission band of the second color filters than in the transmission band of the first color filters.

In an embodiment, a method for generating high-dynamic-range images may include partly absorbing first light propagating from a scene toward a plurality of first pixels of a photosensitive pixel array to attenuate the first light as compared to second light propagating from the scene toward a plurality of second pixels of the photosensitive pixel array. The plurality of second pixels are interleaved with the plurality of first pixels. The method also includes, after the step of partly absorbing, spectrally filtering the first light to form an attenuated color image of the scene on the photosensitive pixel array at the first pixels, and spectrally filtering the second light to form a brighter color image of the scene on the photosensitive pixel array at the second pixels.

DETAILED DESCRIPTION OF THE EMBODIMENTS

Figure 1:
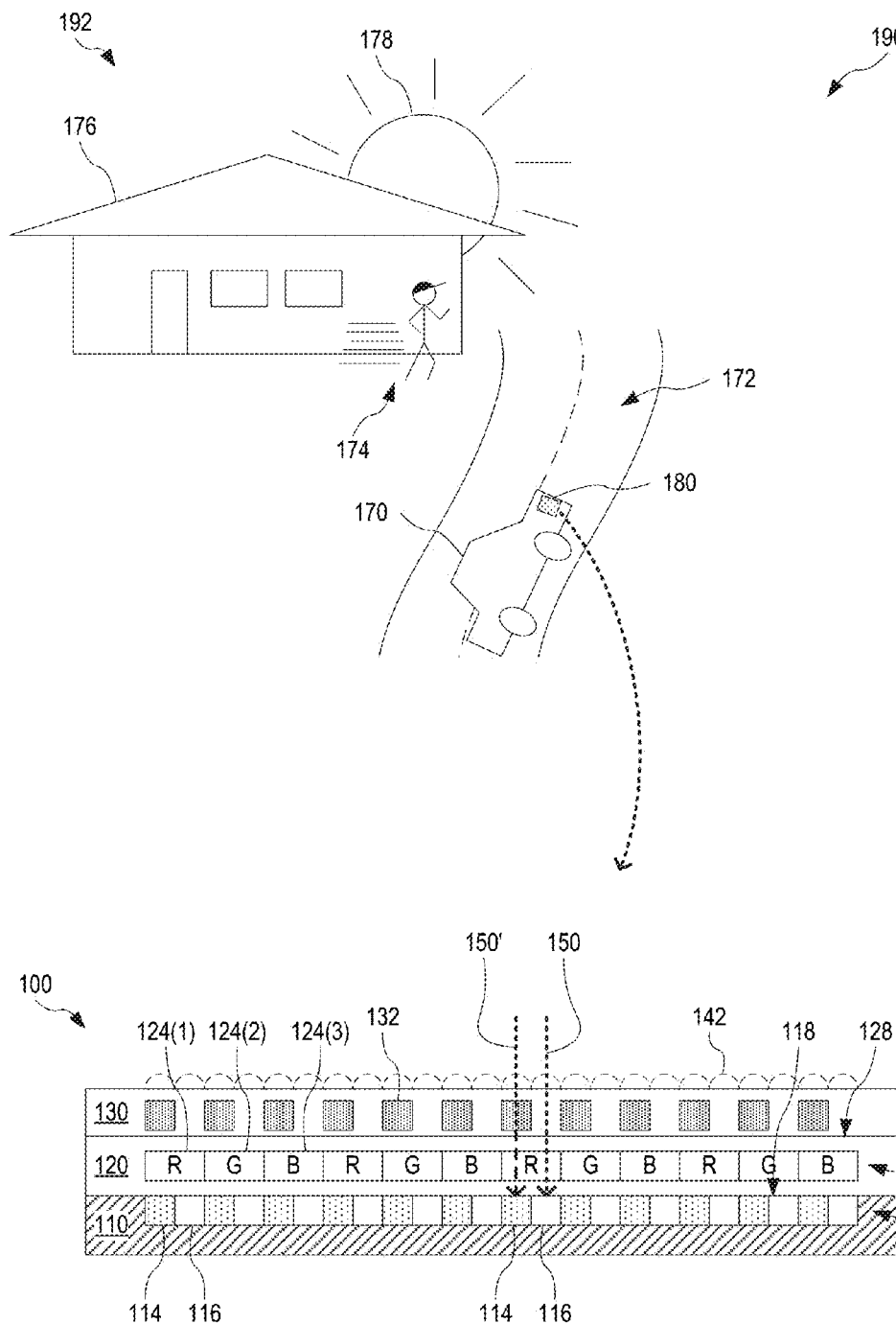
FIG. 1 illustrates a high-dynamic-range (HDR) color image sensor for generating high-dynamic-range images of a scene, according to an embodiment.

FIG. 1 illustrates one exemplary high-dynamic-range (HDR) color image sensor 100 for generating high-dynamic-range images of a scene. FIG. 1 shows HDR color image sensor 100 in an exemplary use scenario 190. HDR color image sensor 100, shown in FIG. 1 in cross-sectional side view, includes a silicon substrate 110 with an photosensitive pixel array 112. HDR color image sensor 100 also includes a color filter layer 120 deposited on planar light-receiving surface 118 of silicon substrate, and a dynamic-range extending layer 130 deposited on surface 128 of color filter layer 120. Surface 128 faces away from silicon substrate 110. Color filter layer 120 provides color sensitivity to HDR color image sensor 100, and dynamic-range extending layer 130 extends the dynamic range of HDR color image sensor 100 beyond that of photosensitive pixel array 112 and its associated readout electronics (not shown in FIG. 1).

Exemplary use scenario 190 utilizes the high dynamic range of HDR color image sensor 100 to capture a color image that properly shows both dim and bright portions of a scene 192. Scene 192 includes a runner 174 about to cross a road 172 in front of a car 170. Car 170 is equipped with an automotive safety system 180 that uses HDR color image sensor 100 to capture images of the scene ahead of car 170, so as to alert a driver or an autonomous vehicle control system of a potential collision. Scene 192 is backlit by sun 178, and a conventional image sensor would not be able to generate an image that shows both (a) road 172 lit by sun 178 and (b) runner 174 in the shadow of house 176. Therefore, the conventional image sensor would likely fail to provide data showing that runner 174 is about to run out into road 172 in front of car 170. In contrast, HDR color image sensor 100, by virtue dynamic-range extending layer 130, is capable of generating an image of scene 192, which shows both road 172 and runner 174. Furthermore, HDR color image sensor 100 provides this image in color, which may further assist automotive safety system 180 in identifying runner 174 against the background of house 176. Automotive safety is only an exemplary application of HDR color image sensor 100. Other applications of HDR color image sensor 100 include camera phones, webcams, and surveillance cameras.

Color filter layer 120 includes a color filter array 122 having a plurality of different types of color filters 124 predominantly sensitive to a different color range, respectively. Each color filter 124 is located above a corresponding pixel of photosensitive pixel array 112 such that light detected by this pixel of photosensitive pixel array is of a certain color. Thus, color filter array 122 enables color image capture by HDR color image sensor 100. For clarity of illustration, not all color filters 124 are labeled in FIG. 1. In the embodiment shown in FIG. 1, color filter array 122 includes three types of color filters 124(1), 124(2), and 124(3). Color filters 124(1), 124(2), and 124(3) are for example sensitive to red, green, and blue light, respectively. Alternatively, color filter array 122 may include three types of color filters 124(1), 124(2), and 124(3) sensitive to cyan, yellow, and magenta light, respectively. Without departing from the scope hereof, color filter array 122 may include only two types of color filters (for example, one type of color filter 124 that selectively transmits light in the visible spectrum, and another type of color filter 124 that selectively transmits light in at least a portion of the infrared spectrum). Also without departing from the scope hereof, color filter array 122 may include four or more different types of color filters. For example, color filter array 122 may include four types of color filters 124 sensitive to red, green, blue, and near-infrared light, respectively, or four types of color filters sensitive to cyan, yellow, green, and magenta light. In addition, color filters 124 may be arranged differently from the configuration shown in FIG. 1, without departing from the scope hereof. For example, red, green, and blue color filters may be arranged in a Bayer-type array. Color filter array 122 may span the gap between surfaces 118 and 128.

Dynamic-range extending layer 130 includes a plurality of grey filters 132 positioned above a plurality of pixels 114 forming a first subset of photosensitive pixel array 112. For clarity of illustration, not all pixels 114 are labeled in FIG. 1. Each grey filter 132 attenuates light propagating toward the corresponding pixel 114, regardless of the color of the light (at least within the sensitivity range of HDR color image sensor 100, such as within the visible spectrum). This is illustrated by exemplary light 150' propagating toward a pixel 114. Grey filter 132 attenuates light 150' as light 150' passes through dynamic-range extending layer 130 toward pixel 114. Another plurality of pixels 116 form a second subset of photosensitive pixel array 112, which is the complement of the first subset formed by pixels 114. For clarity of illustration, not all pixels 116 are labeled in FIG. 1. Pixels 116 are not overlaid by grey filters 132. Therefore, light propagating toward pixels 116 is not attenuated by grey filters 132, as illustrated by exemplary light 150. In an embodiment, dynamic-range extending layer 130 may include material in areas above pixels 116, such that light propagating through dynamic-range extending layer 130 passes through this material. The transmission coefficient for this material of dynamic-range extending layer 130 above pixels 116 is greater than the transmission coefficient of grey filters 132. In one example, the material of dynamic-range extending layer 130 above pixels 116 is substantially transparent. Herein, "transparent" refers to a near 100% transmission coefficient within the overlap between the sensitivity range of photosensitive pixel array 112 and the transmission bands of color filter layer 120 (such as within the visible spectrum). Whether or not dynamic-range extending layer 130 includes material above pixels 116, and whether or not this material is substantially transparent, dynamic-range extending layer 130 attenuates light propagating toward pixels 114, as compared to light propagating toward pixels 116. As a result, the pixel array formed by pixels 116 is more sensitive than the pixel array formed by pixels 114. This difference in sensitivity extends the dynamic range of HDR color image sensor 100 beyond the dynamic range of photosensitive pixel array 112 and its associated readout electronics. The readout electronics are not shown in FIG. 1 but may be at least partly implemented in silicon substrate 110.

In one embodiment, dynamic-range extending layer 130 and color filter layer 120 are both formed from polymeric materials, and grey filters 132 and color filters 124 are formed from photoresist.

The pixel array formed by pixels 114 is at least partly interleaved with the pixel array formed by pixels 116, such that at least a portion of the scene imaged by HDR color image sensor 100 is imaged by both pixels 114 and 116. Although FIG. 1 shows photosensitive pixel array 112 as alternating between pixels 114 and pixels 116, photosensitive pixel array 112 may be laid out according to other configurations, without departing from the scope hereof. In one such example, the resolution of the pixel array formed by pixels 114 is different from the resolution of the pixel array formed by pixels 116. Also without departing from the scope hereof, HDR color image sensor 100 may be configured with fewer or more pixels 114/116 than shown in FIG. 1. For example, HDR color image sensor 100 may include millions or tens of millions of each of pixels 114 and pixels 116. Silicon substrate 110 may implement photosensitive pixel array 112 as a complementary metal oxide semiconductor (CMOS) pixel array.

In certain embodiments, HDR color image sensor 100 further includes a microlens array 140 with a plurality of microlenses 142. Each microlens 142 focuses light through dynamic-range extending layer 130 and color filter layer 120 to a corresponding pixel 114 or 116. Microlens array 140 is for example formed on the surface of dynamic-range extending layer 130 facing away from silicon substrate 110.

Although not shown in FIG. 1, HDR color image sensor 100 may include an additional color filter that applies the same type of color filtering of light propagating to both pixels 114 and pixels 116, without departing from the scope hereof. For example, pixels 114 and 116 may be sensitive to light in the near-infrared spectrum and one or more of color filters 124 may be at least partly transmissive to near-infrared light. In this example, the additional color filter may be an infrared filter configured to substantially block infrared light to limit the sensitivity of HDR color image sensor 100 to the visible spectrum.

Figure 2A:
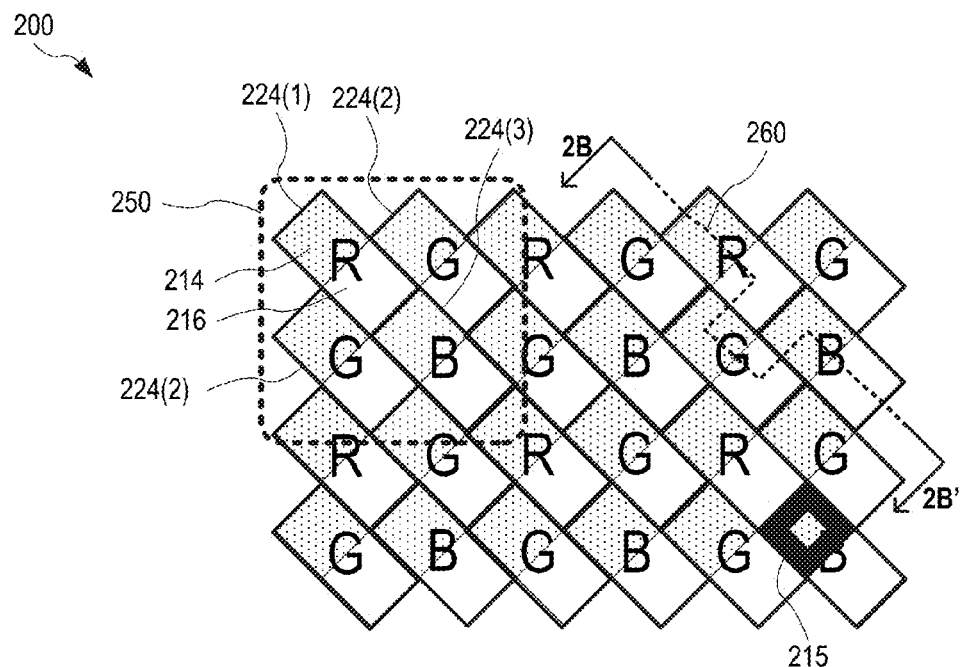
FIGS. 2A and 2B illustrate an HDR color image sensor that implements a higher-sensitivity pixel array and a lower-sensitivity pixel array based on pixels of the same size, according to an embodiment.
Figure 2B:
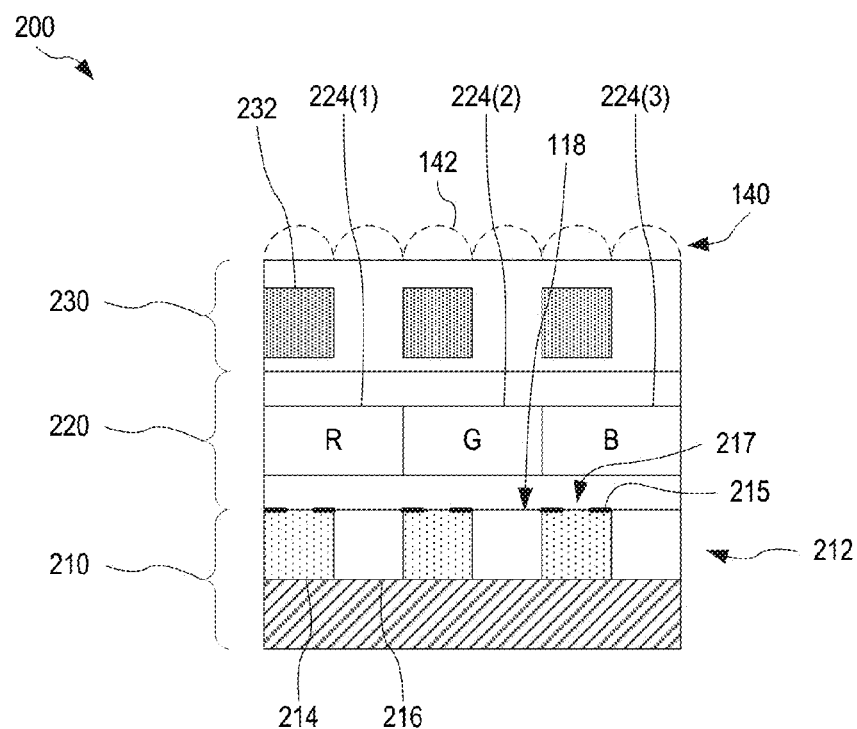

FIGS. 2A and 2B illustrate one exemplary HDR color image sensor 200 that implements a higher-sensitivity pixel array and a lower-sensitivity pixel array based on pixels of the same size. HDR color image sensor 200 is an embodiment of HDR color image sensor 100, implementing pixels 114 and 116 of same size and arranged in respective interleaved pixel arrays. FIG. 2A shows HDR color image sensor 200 in top view, and FIG. 2B shows HDR color image sensor 200 in cross-sectional side view, with the cross section being a folded cross section taken along folded line 2B-2B' of FIG. 2A. FIGS. 2A and 2B are best viewed together.

HDR color image sensor 200 includes a silicon substrate 210 with pixels 214 and 216, of a photosensitive pixel array 212, alternating along folded line 2B-2B'. Silicon substrate 210, pixels 214 and 216, and photosensitive pixel array 212 are embodiments of silicon substrate 110, pixels 114 and 116, and photosensitive pixel array 112, respectively. HDR color image sensor 200 also includes a color filter layer 220 and a dynamic-range extending layer 230, embodiments of color filter layer 120 and dynamic-range extending layer 130, respectively. Color filter layer 220 is configured with three different types of color filters 224(1), 224(2), and 224(3), arranged in a Bayer-like configuration to form a plurality of color pixels groups 250. Color filters 224(1), 224(2), and 224(3) are embodiments of color filters 124(1), 124(2), and 124(3). Each color pixel group 250 includes four pixels 214 and four pixels 216. A color filter 224(1) is deposited on one pair of adjacent pixels 214 and 216. A color filter 224(3) is deposited on another pair of adjacent pixels 214 and 216. Two color filters 224(2) are deposited on two respective pairs of adjacent pixels 214 and 216. Dynamic-range extending layer 230 includes grey filters 232 arranged with a grey filter 232 above each pixel 214 but no grey filter 232 above any of pixels 216. Thus, the array of pixels 214 cooperate with grey filters 232 to form a lower-sensitivity pixel array, while the array of pixels 216 form a higher-sensitivity pixel array. Optionally, HDR color image sensor 200 further includes microlens array 140.

In an embodiment, HDR color image sensor 200 includes an aperture grid 215 forming a light-restricting aperture 217 above each pixel 214. The cross section of light-restricting aperture 217, in dimensions parallel to light-receiving surface 118 is smaller than the cross section of pixel 214 in dimensions parallel to light-receiving surface 118. Aperture grid 215 thus further limits the amount of light transmitted to pixels 214, as compared to the amount of light transmitted to pixels 216, and thus further extends the dynamic range of HDR color image sensor 200. For clarity of illustration, FIG. 2A shows aperture grid 215 above only one of pixels 214, although it is appreciated that aperture grid 215 exists above all pixels 214 in this embodiment.

Although not shown in FIGS. 2A and 2B, HDR color image sensor 200 may include optically inactive areas between each pair of neighboring pixels 214/216, such that no pixel 214/216 is in direct contact with another pixel 214/216, without departing from the scope hereof. In addition, although shown in FIG. 2A as having square cross section, pixels 214 and 216 may have non-square cross section without departing from the scope hereof. For example, the cross section of each of pixels 214 and 216 may be a non-square rectangle. Also without departing from the scope hereof, the orientation of each pixel 214 and 216 may be rotated by 45 degrees as compared to that shown in FIG. 2A, such that the sides of rectangular or square embodiments of pixels 214 and 216 are aligned with sides of photosensitive pixel array 212.

Without departing from the scope hereof, HDR color image sensor 200 may be configured with more pixels 214/216 than shown in FIGS. 2A and 2B. For example, HDR color image sensor 200 may include millions or tens of millions of each of pixels 214 and pixels 216. Likewise, other color filter schemes may be applied, such as those discussed above in reference to FIG. 1. As discussed above in reference to FIG. 1, HDR color image sensor 200 may include an additional filter that applies the same type of color filtering of light propagating to both pixels 214 and pixels 216.

Figure 3A:
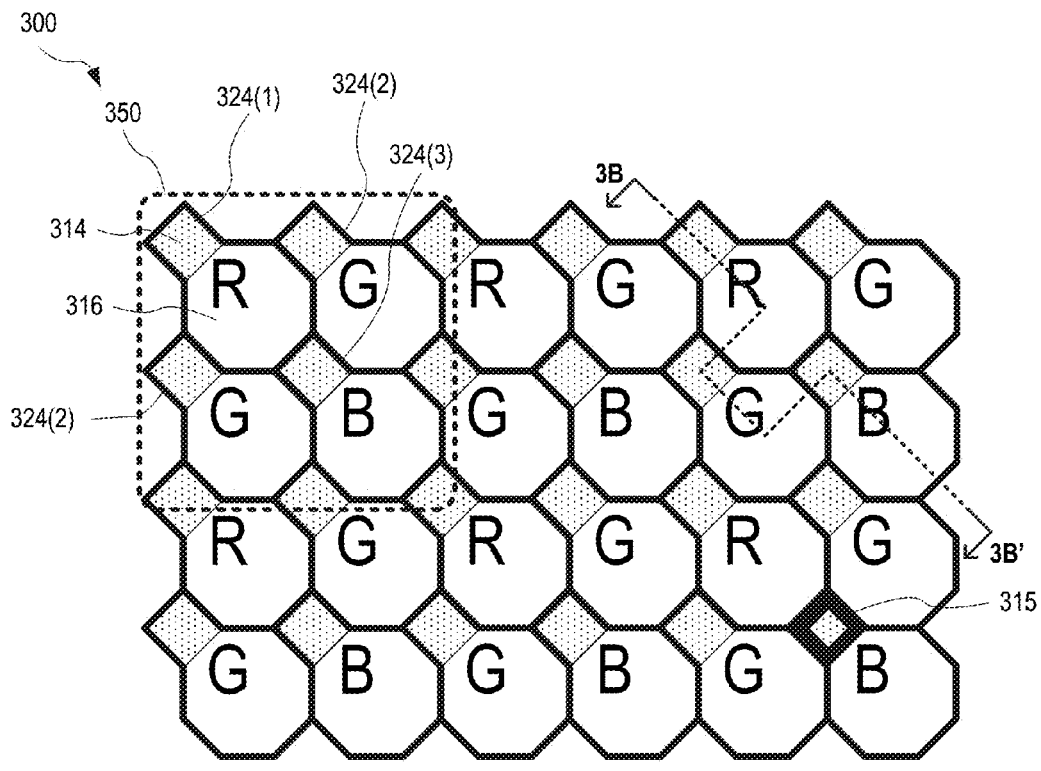
FIGS. 3A and 3B illustrate an HDR color image sensor that implements a higher-sensitivity pixel array with larger pixels and a lower-sensitivity pixel array with smaller pixels, according to an embodiment.
Figure 3B:
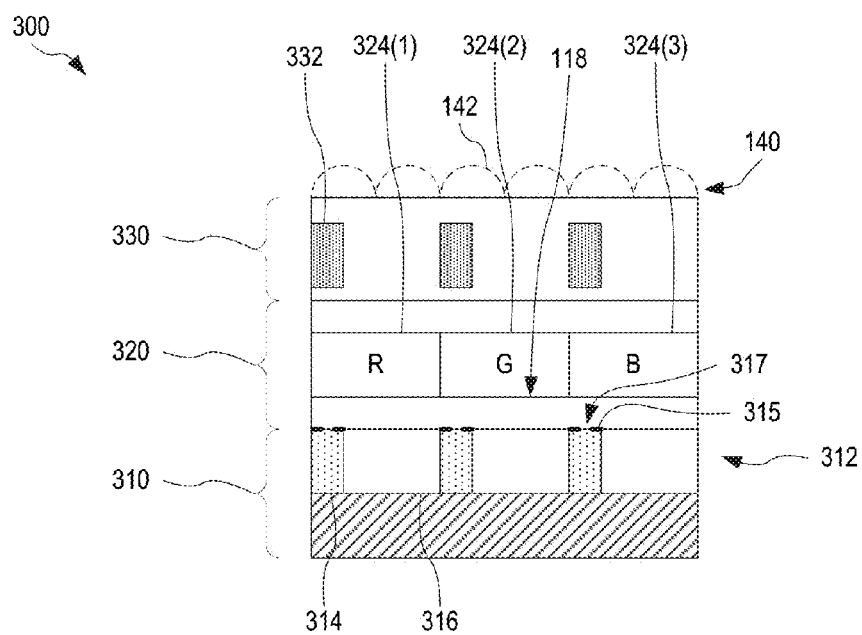

FIGS. 3A and 3B illustrate one exemplary HDR color image sensor 300 that implements a higher-sensitivity pixel array with larger pixels and a lower-sensitivity pixel array with smaller pixels. HDR color image sensor 300 is an embodiment of HDR color image sensor 100 implementing smaller pixels 114 and larger pixels 116 arranged in respective interleaved pixel arrays. FIG. 3A shows HDR color image sensor 300 in top view, and FIG. 3B shows HDR color image sensor 300 in cross-sectional side view, with the cross section being a folded cross section taken along folded line 3B-3B' of FIG. 3A. FIGS. 3A and 3B are best viewed together.

HDR color image sensor 300 includes a silicon substrate 310 with pixels 314 and 316, of a photosensitive pixel array 312, alternating along folded line 3B-3B'. Silicon substrate 310, pixels 314 and 316, and photosensitive pixel array 312 are embodiments of silicon substrate 110, pixels 114 and 116, and photosensitive pixel array 112, respectively. HDR color image sensor 300 also includes a color filter layer 320 and a dynamic-range extending layer 330, embodiments of color filter layer 120 and dynamic-range extending layer 130, respectively. Color filter layer 320 is configured with three different types of color filters 324(1), 324(2), and 324(3), arranged in a Bayer-like configuration to form a plurality of color pixels groups 350. Color filters 324(1), 324(2), and 324(3) are embodiments of color filters 124(1), 124(2), and 124(3). Each color pixel group 350 includes four pixels 314 and four pixels 316. A color filter 324(1) is deposited on one pair of adjacent pixels 314 and 316. A color filter 324(3) is deposited on another pair of adjacent pixels 314 and 316. Two color filters 324(2) are deposited on two respective pairs of adjacent pixels 314 and 316. Dynamic-range extending layer 330 includes grey filters 332 arranged with a grey filter 332 above each pixel 314 but no grey filter 332 above any of pixels 316. Thus, grey filters 332 and the smaller size of pixels 314 cooperate to form a lower-sensitivity pixel array, while the array of larger pixels 316 form a higher-sensitivity pixel array. Optionally, HDR color image sensor 300 further includes microlens array 140.

In an embodiment, HDR color image sensor 300 includes an aperture grid 315 forming a light-restricting aperture 317 above each pixel 314. The cross section of light-restricting aperture 317, in dimensions parallel to light-receiving surface 118 is smaller than the cross section of pixel 314 in dimensions parallel to light-receiving surface 118. Aperture grid 315 thus further limits the amount of light transmitted to pixels 314, as compared to the amount of light transmitted to pixels 316, and thus further extends the dynamic range of HDR color image sensor 300. For clarity of illustration, FIG. 3A shows aperture grid 315 above only one of pixels 314, although it is appreciated that aperture grid 315 exists above all pixels 314 in this embodiment.

Although not shown in FIGS. 3A and 3B, HDR color image sensor 300 may include optically inactive areas between each pair of neighboring pixels 314/316, such that no pixel 314/316 is in direct contact with another pixel 314/316, without departing from the scope hereof. In addition, although shown in FIG. 3A as having square cross section, pixels 314 and 316 may have non-square cross section without departing from the scope hereof. For example, the cross section of each of pixels 314 and 316 may be an octagon. Also without departing from the scope hereof, the orientation of each pixel 314 and 316 may be rotated by 45 degrees as compared to that shown in FIG. 3A, such that the sides of rectangular or square embodiments of pixels 314 and 316 are aligned with sides of photosensitive pixel array 312.

Without departing from the scope hereof, HDR color image sensor 300 may be configured with more pixels 314/316 than shown in FIGS. 3A and 3B. For example, HDR color image sensor 300 may include millions or tens of millions of each of pixels 314 and pixels 316. Likewise, other color filter schemes may be applied, such as those discussed above in reference to FIG. 1. As discussed above in reference to FIG. 1, HDR color image sensor 300 may include an additional filter that applies the same type of color filtering of light propagating to both pixels 314 and pixels 316.

Figure 4:
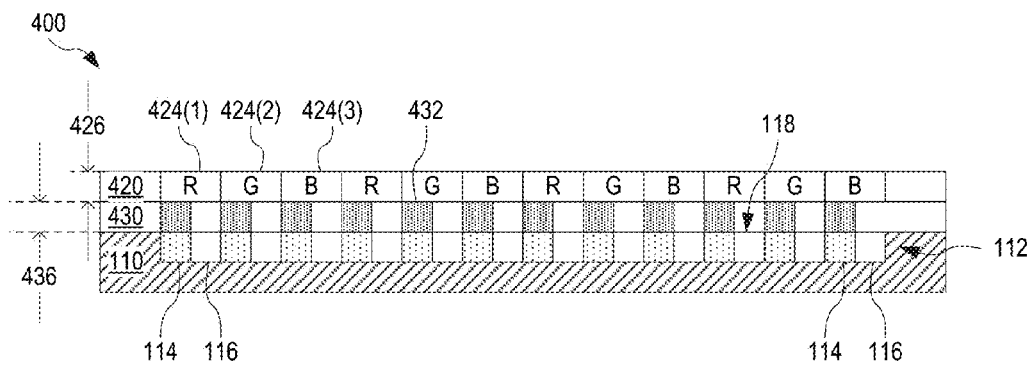
FIG. 4 illustrates an HDR color image sensor which has grey filters disposed between the light-receiving surface of a silicon substrate and a color filter layer.

FIG. 4 illustrates one exemplary HDR color image sensor 400 which has grey filters 432 disposed between the light-receiving surface 118 of silicon substrate 110 and a color filter layer 420. Color filter layer 420 includes red color filters 424(1) that transmit red light, green color filters 424(2) that transmit green light, and blue color filters 424(3) that transmit blue light. HDR color image sensor 400 includes a plurality of grey filters 432 implemented in a dynamic-range extending layer 430 disposed between light-receiving surface 118 and color filter layer 420. A grey filter 432 is disposed above each pixel 114. Each of dynamic-range extending layer 430 and color filter layer 420 are planar, and grey filters 432 spans the distance between light-receiving surface 118 and color filter layer 420. Grey filters 432 and dynamic-range extending layer 430 have uniform thickness 436 across photosensitive pixel array 112. Color filter layer 420 has thickness 426 defined by the thickness of color filters 424(1), 424(2), and 424(3). Thickness 426 is uniform across photosensitive pixel array 112.

Figure 5:
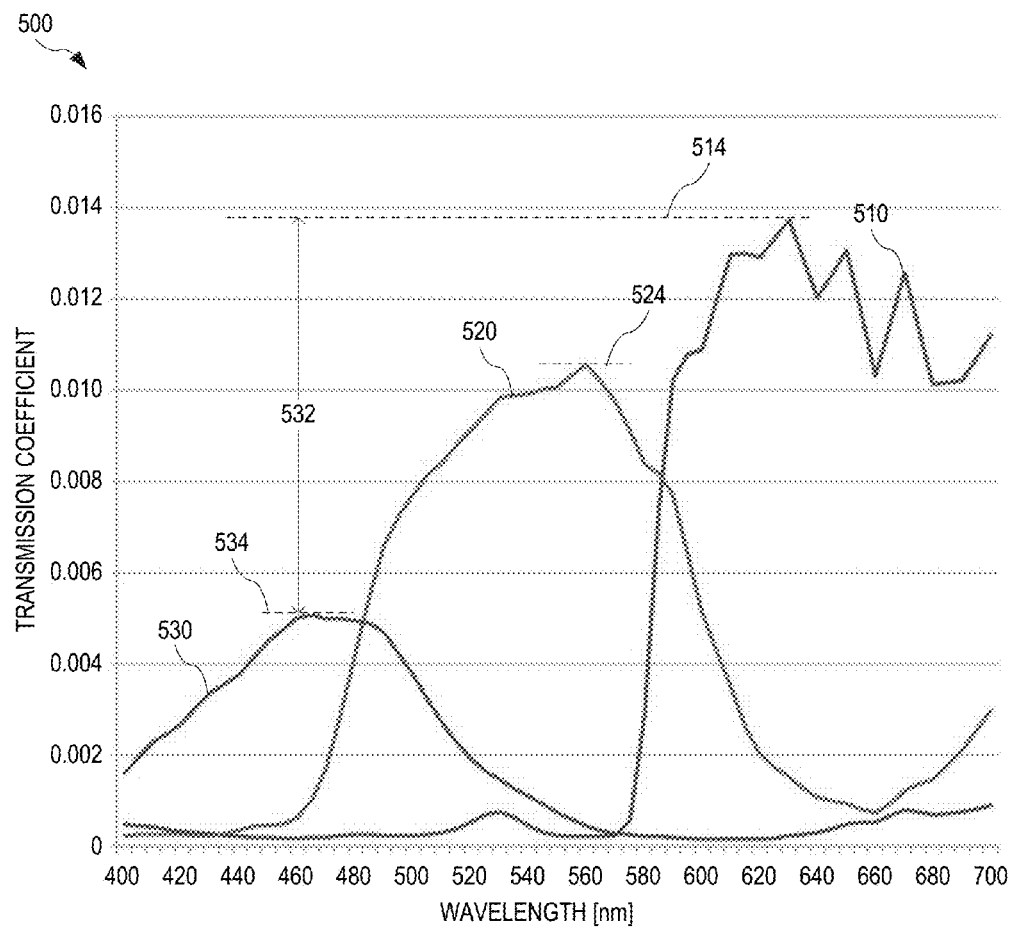
FIG. 5 is a plot of transmission coefficients for the color filter layer and dynamic-range extending layer of the HDR color image sensor of FIG. 4.

FIG. 5 is a plot 500 of transmission coefficients for color filter layer 420 and dynamic-range extending layer 430 of HDR color image sensor 400. Curve 510 is the transmission coefficient as a function of wavelength for light incident on red color filters 424(1) above grey filter 432. Curve 520 is the transmission coefficient as a function of wavelength for light incident on green color filters 424(2) above grey filter 432. Curve 530 is the transmission coefficient as a function of wavelength for light incident on blue color filters 424(3) above grey filter 432. A strong imbalance between the transmission coefficients is evident, with a marked reduction 532 of the peak level 534 of the transmission coefficient for blue light incident on blue color filters 424(3) as compared to the peak level 514 of the transmission coefficient for red light incident on red color filters 424(1). Peak level 534 is only approximately 35% of peak level 514. The peak level 524 of the transmission coefficient for green light incident on green color filters 424(2) is approximately 75% of peak level 514. These imbalances are primarily caused by the transmission coefficient of grey filters 432 being wavelength dependent. Grey filters 432, as is the case for most materials, attenuate light of shorter wavelengths more strongly than light of longer wavelength. Since each grey filter 432 has the same thickness 436, regardless of which color filter 424 is above the grey filter 432, dynamic-range extending layer 430 affects the transmission of light incident on red color filters 424(1), green color filters 424(2), and blue color filters 424(3) in a wavelength dependent manner, which causes the color imbalance evident in plot 500.

Figure 6:
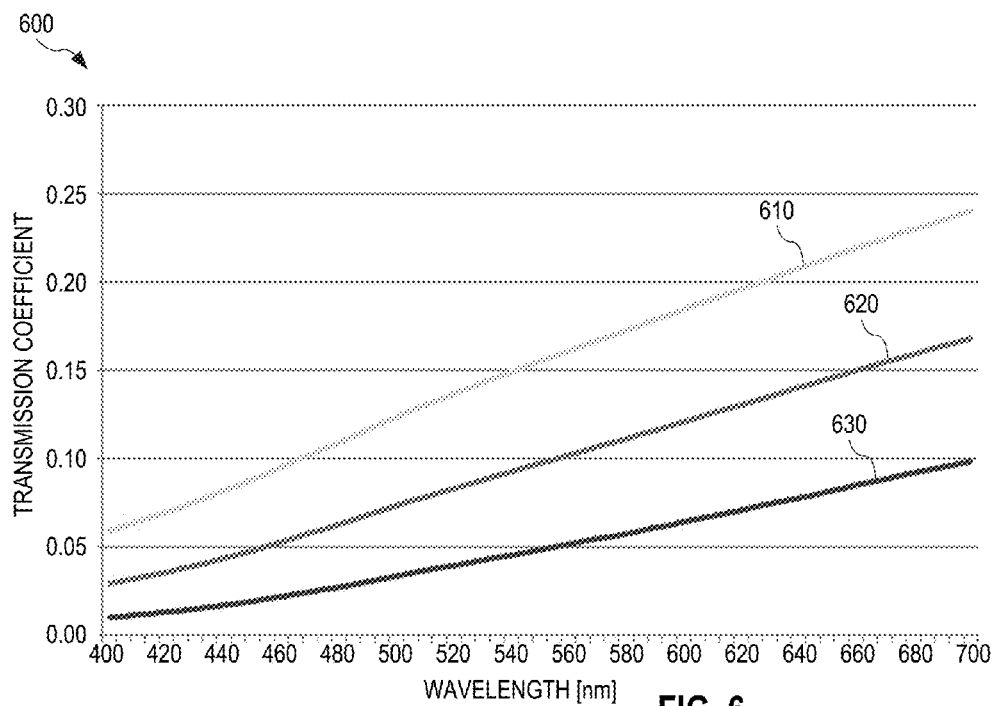
FIG. 6 is a plot of the transmission coefficients for one embodiment of the grey filter of the HDR color image sensor of FIG. 1 for three different thickness of the grey filter.

FIG. 6 is a plot 600 of transmission coefficients for one embodiment of grey filter 132 of HDR color image sensor 100 for three different thickness of grey filter 132. Curve 610 is the transmission coefficient as a function of wavelength for light incident this embodiment of grey filter 132 having a thickness of 0.4 microns. Curve 620 is the transmission coefficient as a function of wavelength for light incident this embodiment of grey filter 132 having a thickness of 0.5 microns. Curve 630 is the transmission coefficient as a function of wavelength for light incident this embodiment of grey filter 132 having a thickness of 0.6 microns. Each of curves 610, 620, and 630 show a wavelength dependent transmission coefficient with the transmission coefficient increasing with wavelength.

Figure 7:
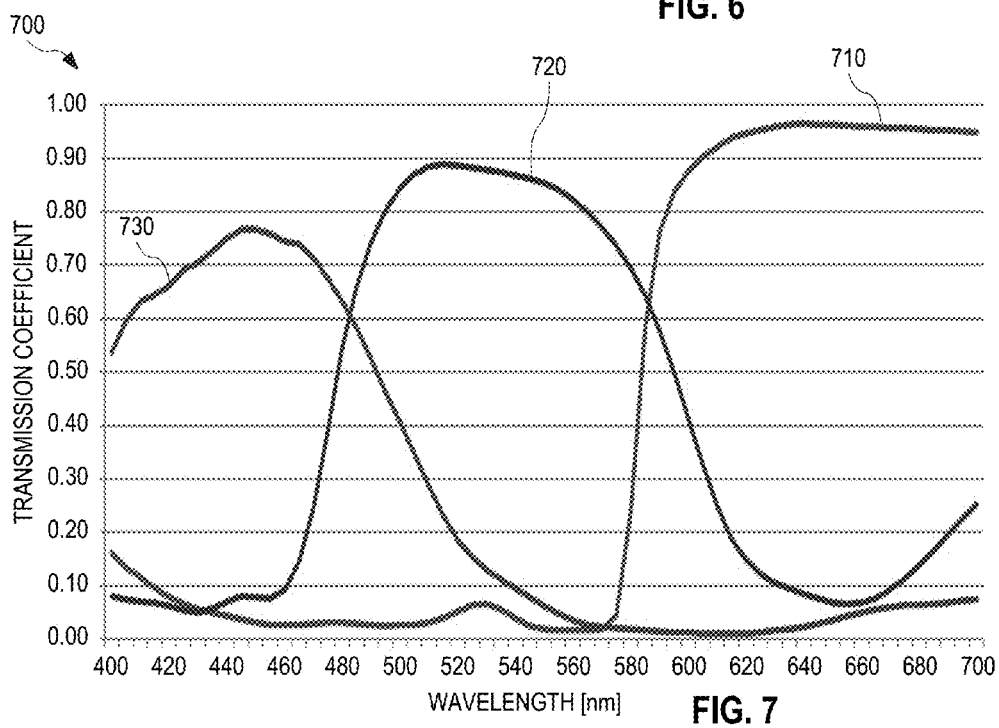
FIG. 7 is a plot of transmission coefficients for certain embodiments of the color filters of the HDR color image sensor of FIG. 1.

FIG. 7 is a plot 700 of transmission coefficients for certain embodiments of color filters 124(1), 124(2), and 124(3) of HDR color image sensor 100, wherein color filter 124(1) transmits red light, color filter 124(2) transmits green light, and color filter 124(3) transmits blue light. Curve 710 is the transmission coefficient as a function of wavelength for this embodiment of color filter 424(1). Curve 720 is the transmission coefficient as a function of wavelength for light incident on this embodiment of color filter 124(2). Curve 730 is the transmission coefficient as a function of wavelength for light incident on this embodiment of color filter 124(3). Plot 700 demonstrates good color balance in the absence of grey filters 132. However, if color filters 124(1), 124(2), and 124(3) are combined with grey filters 132, each having the same thickness (as is the case in HDR color image sensor 400), the color imbalance of plot 500 results.

Figure 8:
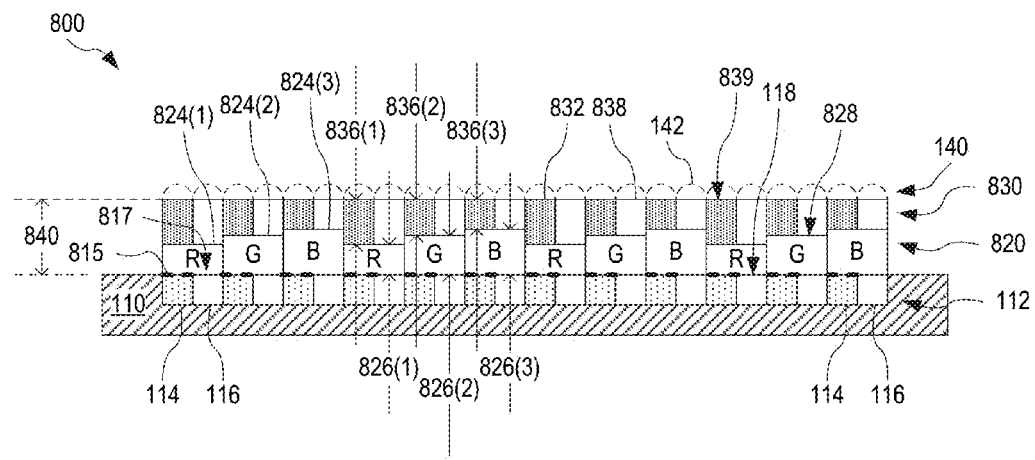
FIG. 8 illustrates an HDR color image sensor implementing grey filters of different thicknesses, according to an embodiment.

FIG. 8 illustrates one exemplary HDR color image sensor 800 implementing grey filters of different thicknesses. HDR color image sensor 800 is an embodiment of HDR color image sensor 100. HDR color image sensor 800 implements grey filters 132 of different thicknesses to compensate for wavelength dependent transmission of the material of grey filters 132. HDR color image sensor 800 represents an improvement over HDR color image sensor 400. HDR color image sensor 800 includes a color filter layer 820 and a dynamic-range extending layer 830, embodiments of color filter layer 120 and dynamic-range extending layer 130, respectively. Dynamic-range extending layer 830 is formed above color filter layer 820. As will be discussed in further detail below in reference to FIGS. 14 and 16A-D, the configuration of HDR color image sensor 800, with dynamic-range extending layer 830 deposited above color filter layer 820, enables formation of grey filters of different thicknesses using a single photolithographic deposition step. In contrast, if grey filters 432 of HDR color image sensor 400 were to be manufactured with different thicknesses using photolithographic deposition methods, a separate photolithographic deposition step would be required for each different thickness.

Color filter layer 820 includes red color filters 824(1) that transmit red light, green color filters 824(2) that transmit green light, and blue color filters 824(3) that transmit blue light. Color filters 824(1), 824(2), and 824(3) are embodiments of color filters 124(1), 124(2), and 124(3), respectively. Dynamic-range extending layer 830 includes a plurality of grey filters 832 respectively disposed over the plurality of pixels 114. Grey filters 832 are embodiments of grey filters 132. Grey filters 832 disposed over red color filters 824(1) have thickness 836(1). Grey filters 832 disposed over green color filters 824(2) have thickness 836(2). Grey filters 832 disposed over blue color filters 824(3) have thickness 836(3). Thickness 836(1) exceeds thickness 836(2), and thickness 836(2) exceeds thickness 836(3), to compensate for the transmission coefficient of grey filters 832 being an increasing function of wavelength (see FIG. 6). By virtue of the differences in thicknesses 836(1), 836(2), and 836(3), HDR color image sensor 800 may achieve satisfactory color balance, while benefitting from the extended dynamic range provided by grey filters 832.

Color filters 824(1), 824(2), and 824(3) have respective thicknesses 826(1), 826(2), and 826(3), which are configured to combine with thicknesses 836(1), 836(2), and 836(3) to maintain a uniform distance 840 from light-receiving surface 118 to the surface of grey filters 832 facing away from silicon substrate 110 for all grey filters 832. Thus, thickness 826(1) is smaller than thickness 826(2) which, in turn, is smaller than thickness 826(3), such that (a) thicknesses 826(1) and 836(1) add up to thickness 840, (b) thicknesses 826(2) and 836(2) add up to thickness 840, and (c) thicknesses 826(3) and 836(3) add up to thickness 840. Due to the differences in thicknesses 826(1), 826(2), and 826(3), the surface 828 of color filter layer 820 is not planar but rather includes several different planar surfaces offset from each other in the direction perpendicular to light-receiving surface 118. Surface 828 is an embodiment of surface 128.

Thicknesses 836(1), 836(2), and 836(3) may be in the range between 0.3 and 0.8 microns. In one embodiment, thickness 836(1) is in the range from 0.55 to 0.65 microns, thickness 836(2) is in the range from 0.45 to 0.55 microns, thickness 836(3) is in the range 0.35 to 0.45 microns, thickness 826(1) is in the range from 0.65 to 0.75 microns, thickness 826(2) is in the range from 0.75 to 0.85 microns, and thickness 826(3) is in the range from 0.85 to 0.95 microns. These thicknesses cooperate to properly compensate for the wavelength dependent transmission of grey filters 832 while attenuating, within grey filters 832, light incident on grey filters 832 by 95% or more. In certain embodiments, the combined transmission coefficient for grey filters 832 and color filter layer 820 for different types of color filters 824 (e.g., color filters 824(1), 824(2), and 824(3)) deviates by no more than 40%, such that the lowest of the transmission coefficient peak levels is at least 60% of the highest of the transmission peak levels.

In an embodiment, each color filter 824(1), 824(2), and 824(3) is in direct contact with the adjacent color filters 824(1), 824(2), and/or 824(3). In this embodiment, color filter layer 820 may be composed of 824(1), 824(2), and 824(3). In an embodiment, dynamic-range extending layer 830 includes material 838 in the gaps between grey filters 832, such that dynamic-range extending layer 830 forms a continuous planar surface 839 facing away from silicon substrate 110. In this embodiment, the combined thickness of color filter layer 820 and dynamic-range extending layer 830 is uniform across photosensitive pixel array 112 and equals distance 840. Material 838 is more light transmissive than grey filters 832, at least within the transmission bands of color filters 824(1), 824(2), and 824(3). In one example, material 838 is a substantially transparent material. In another example, the transmission coefficient of material 838 at least a factor of 20 greater than the transmission coefficient of grey filters 832 (for equal thicknesses of material 838 and grey filters 832). HDR color image sensor 800 may include microlens array 839 disposed on surface 839, optionally with an additional color filter disposed therebetween such as the additional color filter discussed above in reference to FIG. 1.

In one embodiment, pixels 114 and 116 and color filters 824 are, in dimensions parallel to light-receiving surface 118, arranged according to the configuration of HDR color image sensor 200. In another embodiment, pixels 114 and 116 and color filters 824 are, in dimensions parallel to light-receiving surface 118, arranged according to the configuration of HDR color image sensor 300.

In an embodiment, HDR color image sensor 800 includes an aperture grid 815 forming a respective light-restricting aperture 817 above each pixel 114. The functionality of aperture grid 815 is similar to that of aperture grids 215 and 315, and HDR color image sensor 800 may implement aperture grid 815 configured as aperture grid 215 or 315.

Although not shown in FIG. 8, HDR color image sensor 800 may include optically inactive areas between each pair of neighboring pixels 114/116, such that no pixel 114/116 is in direct contact with another pixel 114/116, without departing from the scope hereof. The cross section of pixels 114/116 may be square, non-square rectangular, or octagonal, for example as discussed above in reference to FIGS. 2A-3B. Without departing from the scope hereof, HDR color image sensor 800 may be configured with more pixels 114/116 than shown in FIG. 8. For example, HDR color image sensor 800 may include millions or tens of millions of each of pixels 114 and pixels 116. Likewise, other color filter schemes may be applied, such as those discussed above in reference to FIG. 1.

Figure 9:
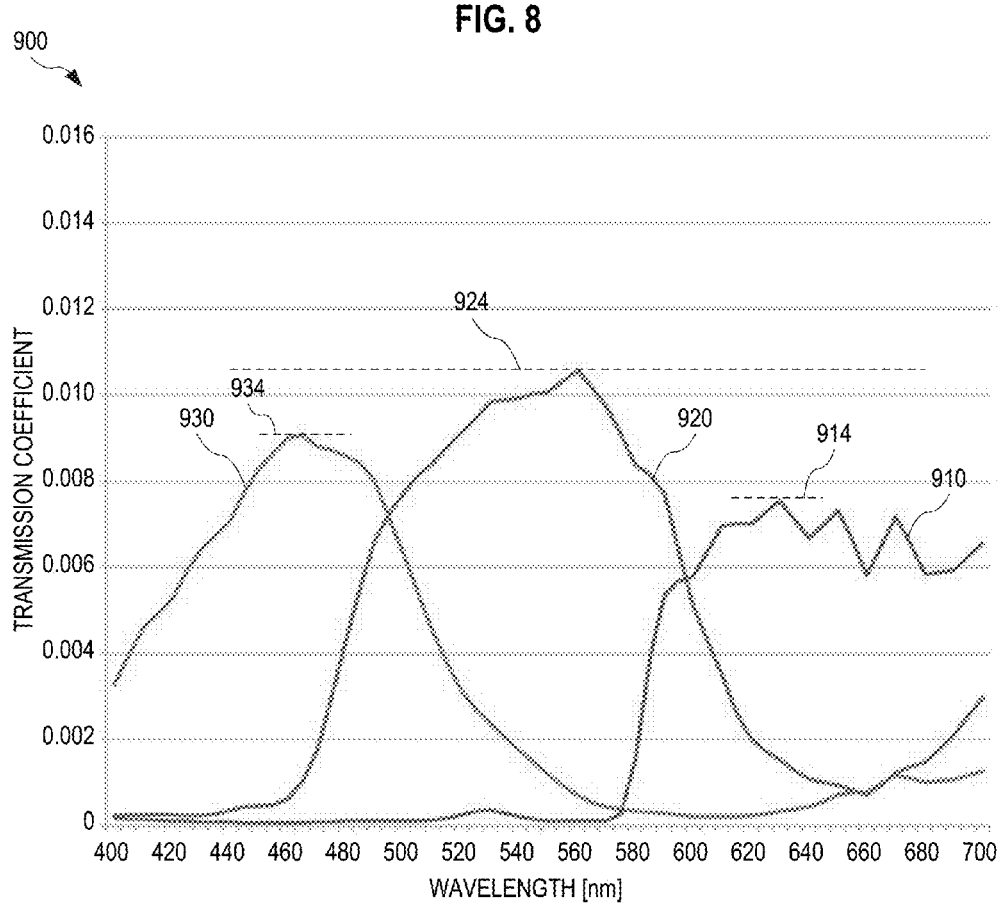
FIG. 9 is a plot of transmission coefficients for the grey filters and color filter layer of one embodiment of the HDR color image sensor of FIG. 8, according to an embodiment.

FIG. 9 is a plot 900 of transmission coefficients for grey filters 832 and color filter layer 820 of one embodiment of HDR color image sensor 800. In this embodiment, (a) color filters 824(1), 824(2), and 824(3) transmit red, green, and blue light, respectively, thickness 836(1) is 0.6 microns, thickness 836(2) is 0.5 microns, thickness 836(3) is 0.4 microns, thickness 826(1) is 0.7 microns, thickness 826(2) is 0.8 microns, and thickness 826(3) is 0.9 microns.

Curve 910 is the transmission coefficient as a function of wavelength for light incident on grey filters 832 above red color filters 824(1). Curve 920 is the transmission coefficient as a function of wavelength for light incident on grey filters 832 above green color filters 824(2). Curve 930 is the transmission coefficient as a function of wavelength for light incident on grey filters 832 above blue color filters 824(3). As compared to the transmission coefficients shown in plot 500 for HDR color image sensor 400, plot 900 shows significantly improved color balance. Curve 920, associated with green color filters 824(2), exhibits the highest peak level 924 of the transmission coefficient. Peak level 934 of curve 930, associated with blue color filters 824(3), is approximately 85% of peak level 924. Peak level 914 of curve 910, associated with red color filters 824(1), is approximately 70% of peak level 924.

Figure 10:
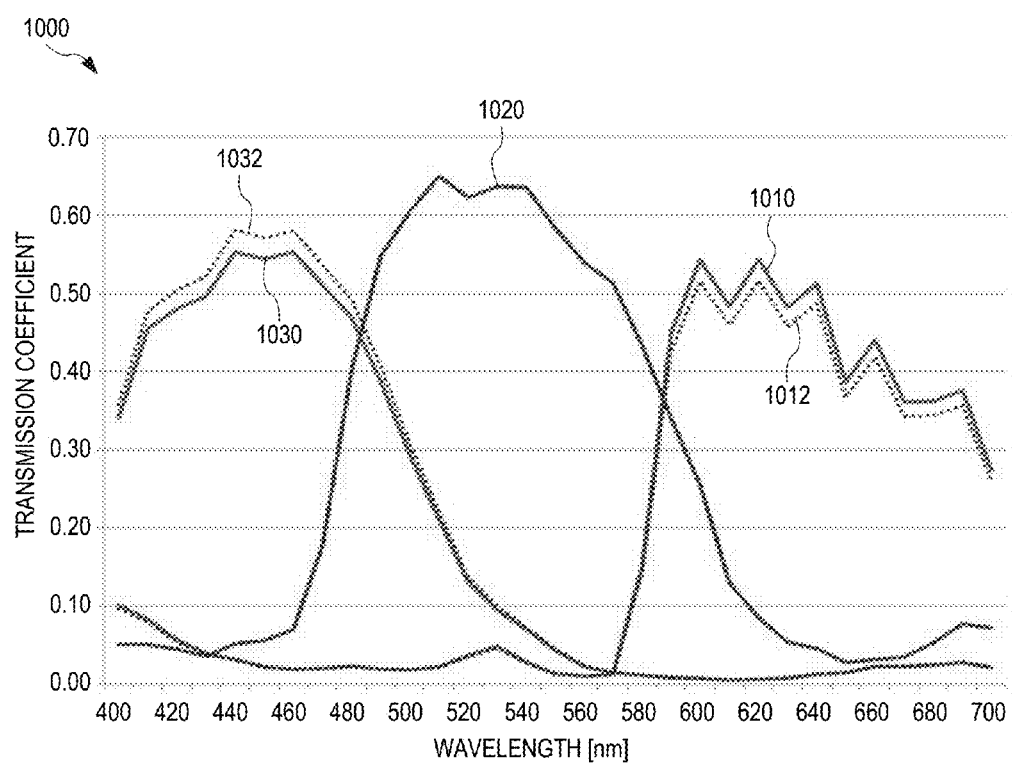
FIG. 10 is a plot of the transmission coefficients as a function of wavelength for the color filter layer and dynamic-range extending layer of the same embodiment of the HDR color image sensor of FIG. 8 forming the basis for FIG. 9, for regions of the dynamic-range extending layer not occupied by grey filters.

FIG. 10 is a plot 1000 of the transmission coefficients as a function of wavelength for color filter layer 820 and dynamic-range extending layer 830 of the same embodiment of HDR color image sensor 800 forming the basis for FIG. 9, for regions of dynamic-range extending layer 830 occupied by material 838. In this embodiment, material 838 is substantially transparent.

Curve 1010 is the transmission coefficient as a function of wavelength for light incident on material 838 above red color filters 824(1). Curve 1020 is the transmission coefficient as a function of wavelength for light incident on material 838 above green color filters 824(2). Curve 1030 is the transmission coefficient as a function of wavelength for light incident on material 838 above blue color filters 824(3). A comparison of curves 1010, 1020, and 1030 with curves 910, 920, and 930 show very similar color responses for light incident on grey filters 832 and material 838. Together, plots 900 and 1000 illustrate, by example, excellent color response for HDR color image sensor 800, with no significant color distortion caused by grey filters 832.

For comparison, plot 1000 also shows curves 1012 and 1032. Curve 1012 is the transmission coefficient as a function of wavelength for 0.8 micron thick version of color filters 824(1) and 824(3), i.e., same thickness as that of color filter 824(2). Plot 1000 shows that the transmission coefficients of color filters 824(1) and 824(3) are minimally affected by the change in thickness required to maintain a uniform combined thickness of color filter layer 820 and dynamic-range extending layer 830 in the presence of grey filters 832 having a variety of thicknesses 836.

Without departing from the scope hereof, the composition of one or more of color filters 824(1), 824(2), and 824(3) may be adjusted to compensate for the effect of the different thicknesses 826(1), 826(2), and 826(3) on the transmission coefficients shown in FIG. 10, to reduce or eliminate the deviation of curves 1010 and 1030 from curves 1012 and 1032, respectively.

Figure 11:
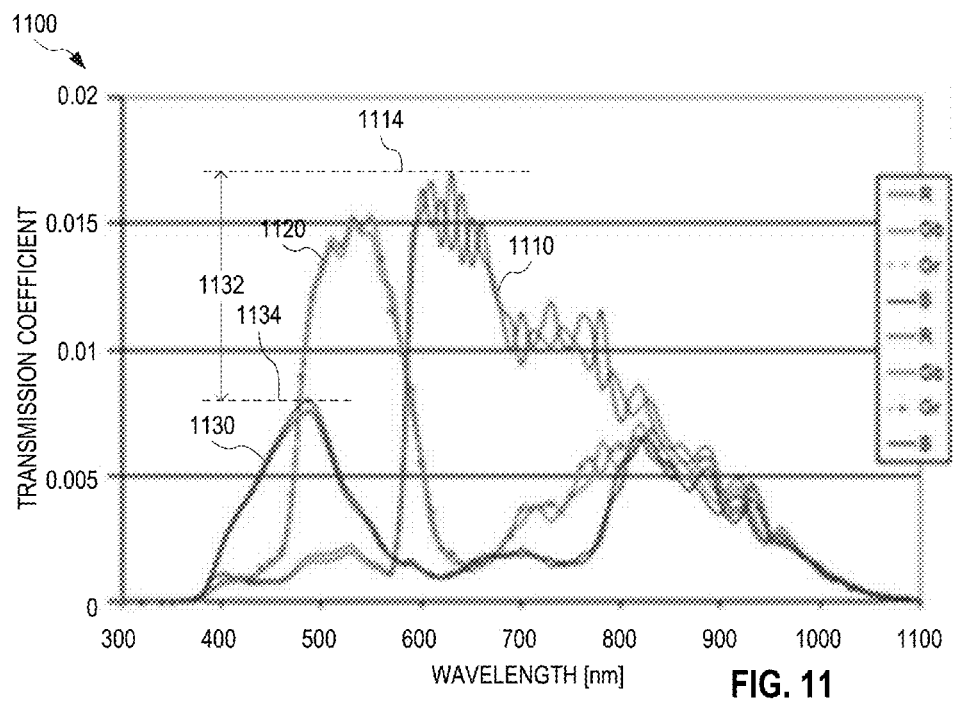
FIG. 11 is a plot of measured transmission coefficients for the color filter layer and the dynamic-range extending layer of one example of the HDR color image sensor of FIG. 4.

FIG. 11 is a plot 1100 of measured transmission coefficients for color filter layer 420 and dynamic-range extending layer 430 of HDR color image sensor 400, wherein thickness 426 of color filter layer 420 is 0.8 microns and thickness 436 of dynamic-range extending layer 430 is 0.5 microns. Curve 1110 is the measured transmission coefficient as a function of wavelength for light incident on red color filters 424(1) above grey filter 432. Curve 1120 is the measured transmission coefficient as a function of wavelength for light incident on green color filters 424(2) above grey filter 432. Curve 1130 is the measured transmission coefficient as a function of wavelength for light incident on blue color filters 424(3) above grey filter 432. A strong imbalance between the transmission coefficients is evident, in particular with a marked reduction 1132 of the peak level 1134 of the transmission coefficient for blue light incident on blue color filters 424(3) as compared to the peak level 1114 of the transmission coefficient for red light incident on red color filters 424(1).

Figure 12:
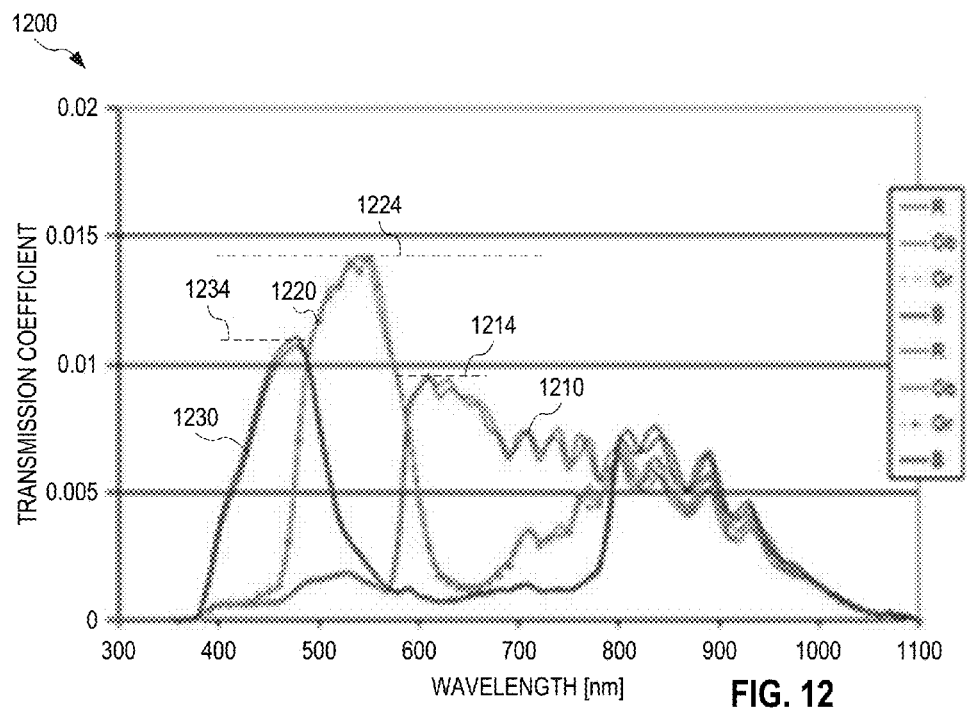
FIG. 12 is a plot of measured transmission coefficients for the grey filters and color filter layer of one embodiment of the HDR color image sensor of FIG. 8.

FIG. 12 is a plot 1200 of measured transmission coefficients for grey filters 832 and color filter layer 820 of one embodiment of HDR color image sensor 800. In this embodiment, (a) color filters 824(1), 824(2), and 824(3) transmit red, green, and blue light, respectively, thickness 836(1) is 0.6 microns, thickness 836(2) is 0.5 microns, thickness 836(3) is 0.4 microns, thickness 826(1) is 0.7 microns, thickness 826(2) is 0.8 microns, and thickness 826(3) is 0.9 microns.

Curve 1210 is the measured transmission coefficient as a function of wavelength for light incident on grey filters 832 above red color filters 824(1). Curve 1220 is the measured transmission coefficient as a function of wavelength for light incident on grey filters 832 above green color filters 824(2). Curve 1230 is the measured transmission coefficient as a function of wavelength for light incident on grey filters 832 above blue color filters 824(3). As compared to the measured transmission coefficients shown in plot 1100 for HDR color image sensor 400, plot 1200 shows significantly improved color balance. Curve 1220, associated with green color filters 824(2), exhibits the highest peak level 1224 of the transmission coefficient. Peak level 1234 of curve 1230, associated with blue color filters 824(3), is approximately 80% of peak level 1224. Peak level 1214 of curve 1210, associated with red color filters 824(1), is approximately 65% of peak level 1224.

Figure 13:
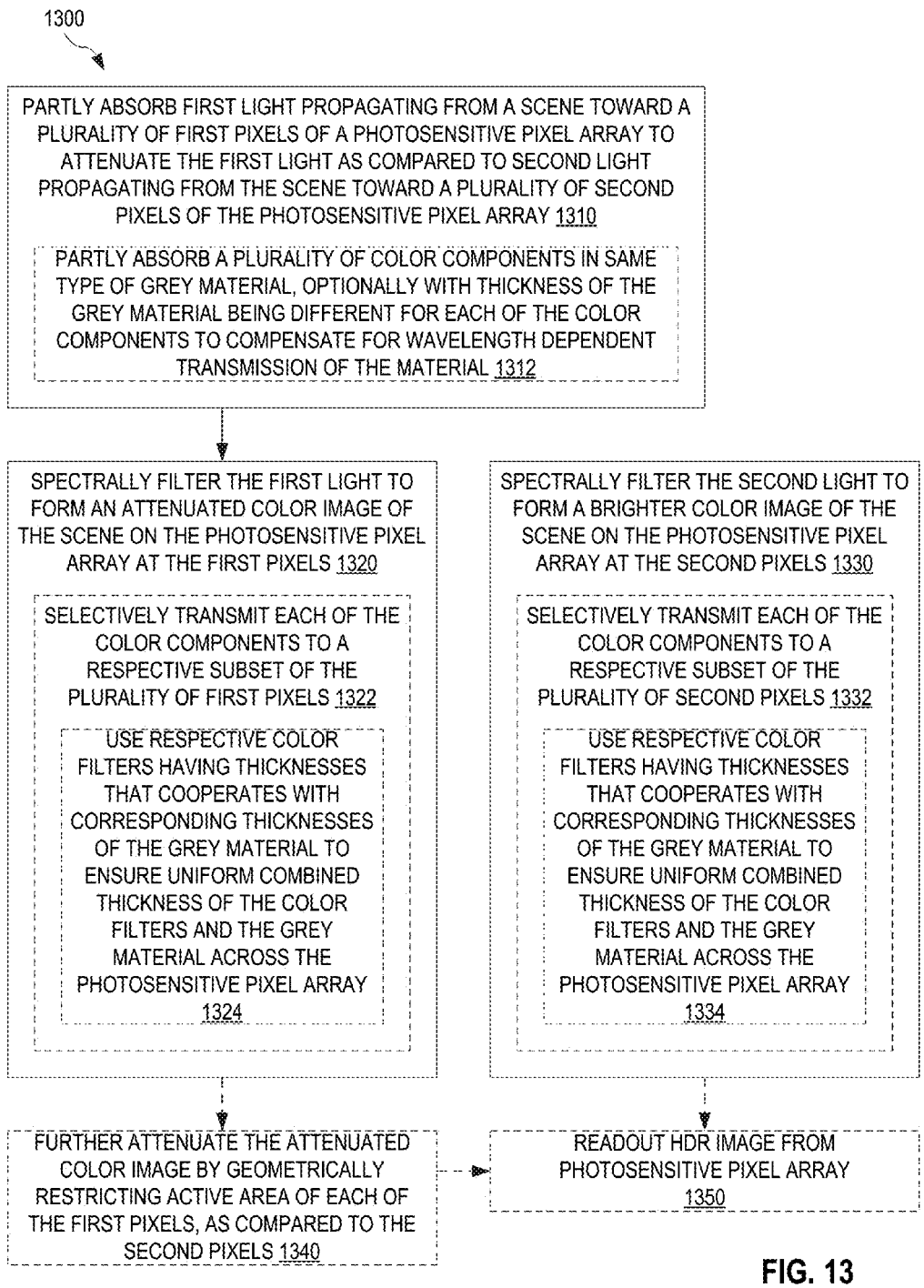
FIG. 13 illustrates a method for generating high-dynamic-range images, according to an embodiment.

FIG. 13 illustrates one exemplary method 1300 for generating high-dynamic-range images. Method 1300 may be performed by HDR color image sensor 100. Certain embodiments of method 1300 may be performed by HDR color image sensor 800.

In a step 1310, method 1300 partly absorbs first light propagating from a scene toward a plurality of first pixels of a photosensitive pixel array to attenuate the first light as compared to second light propagating from the scene toward a plurality of second pixels of the photosensitive pixel array. In one example of step 1310, grey filters 132 of dynamic-range extending layer 130 attenuate light 150' propagating from scene 192 toward pixels 114 of photosensitive pixel array 112.

A subsequent step 1320 spectrally filters the first light to form an attenuated color image of the scene on the photosensitive pixel array at the first pixels. In one example of step 1320, color filters 124 of color filter layer 120 spectrally filters light 150' to form an attenuated color image of scene 192 on photosensitive pixel array 112 at pixels 114. A step 1330 spectrally filters the second light to form a brighter color image of the scene on the photosensitive pixel array at the second pixels. In one example of step 1330, color filters 124 of color filter layer 120 spectrally filters light 150 to form a brighter image of scene 192 on photosensitive pixel array 112 at pixels 116. Since grey filters 132 attenuates light 150' as compared to light 150, the image formed on pixels 116 in step 1330 is brighter than the image formed on pixels 114 in step 1320.

In an embodiment, step 1320 includes a step 1322 and step 1330 includes a step 1332. Step 1322 selectively transmits each of a plurality of color components to a respective subset of the plurality of first pixels. Step 1332 selectively transmits each of the color components to a respective subset of the plurality of second pixels. In one example of steps 1322 and 1332, color filters 124(1) selectively transmits red components of light 150 and 150', color filters 124(2) selectively transmits green components of light 150 and 150', and color filters 124(3) selectively transmits blue components of light 150 and 150', for example with transmission coefficients similar to those plotted in FIG. 7.

Step 1310 may include a step 1312 of partly absorbing a plurality of color components in the same type of grey material. In one example of step 1312, all grey filters 132 of dynamic-range extending layer 130, regardless of which type of color filter 124 is located underneath, are made of the same material. In certain embodiments, the thickness of the grey material is different for each of the color components to compensate for wavelength dependent transmission of the material. In one example of step 1310 implementing step 1312 with grey filters of such different thicknesses, grey filters 832 of dynamic-range extending layer 830 attenuate light 150' propagating from scene 192 toward pixels 114 of photosensitive pixel array 112 in HDR color image sensor 800. In this example, grey filters 832 positioned above red color filters 824(1) have thickness 836(1), grey filters 832 positioned above green color filters 824(2) have thickness 836(2), and grey filters 832 positioned above green color filters 824(3) have thickness 836(3), wherein thickness 836(1) exceeds thickness 836(2) which, in turn, exceeds thickness 836(3).

In embodiments of method 1300 that include step 1312 with different thicknesses of the grey material may, step 1322 may include a step 1324 and step 1332 may include a step 1334. Step 1324 uses respective color filters having thicknesses that cooperate with corresponding thicknesses of the grey material to ensure uniform combined thickness of the color filters and the grey material across the photosensitive pixel array. Similarly, step 1334 uses respective color filters having thicknesses that cooperate with corresponding thicknesses of the grey material to ensure uniform combined thickness of the color filters and the grey material across the photosensitive pixel array. In one example of method 1300 implementing steps 1324 and 1334, color filters 824(1), 824(2), and 824(3) of color filter layer 820 have different respective thicknesses 826(1), 826(2), and 826(3) to achieve a uniform combined thickness 840 of dynamic-range extending layer 830 and color filter layer 820 across photosensitive pixel array 112 in HDR color image sensor 800. In this example, thickness 826(1) is less than thickness 826(2) which, in turn, is less than thickness 826(3).

Optionally, method 1300 may include a step 1340 of further attenuating the attenuated color image by geometrically restricting the active area of each of the first pixels, as compared to the second pixels. In one example of step 1340, aperture grid 215, 315, or 815 blocks a portion of light propagating toward pixels 114 by restricting the transmission of such light to respective light-restricting apertures 217, 317, or 817, each of which have a smaller cross section than the corresponding embodiments of pixels 114.

Method 1300 may also include a step 1350 of reading out an HDR image from the photosensitive pixel array. The HDR image includes (a) a lower-sensitivity image formed on the first pixels from the first light and (b) a higher-sensitivity image formed on the second pixels from the second light. In one example of step 1350, readout electronics associated with photosensitive pixel array 112 reads out an HDR image that includes (a) a lower-sensitivity image formed on pixels 114 from light 150' and (b) a higher-sensitivity image formed on pixels 116 from light 150.

Figure 14:
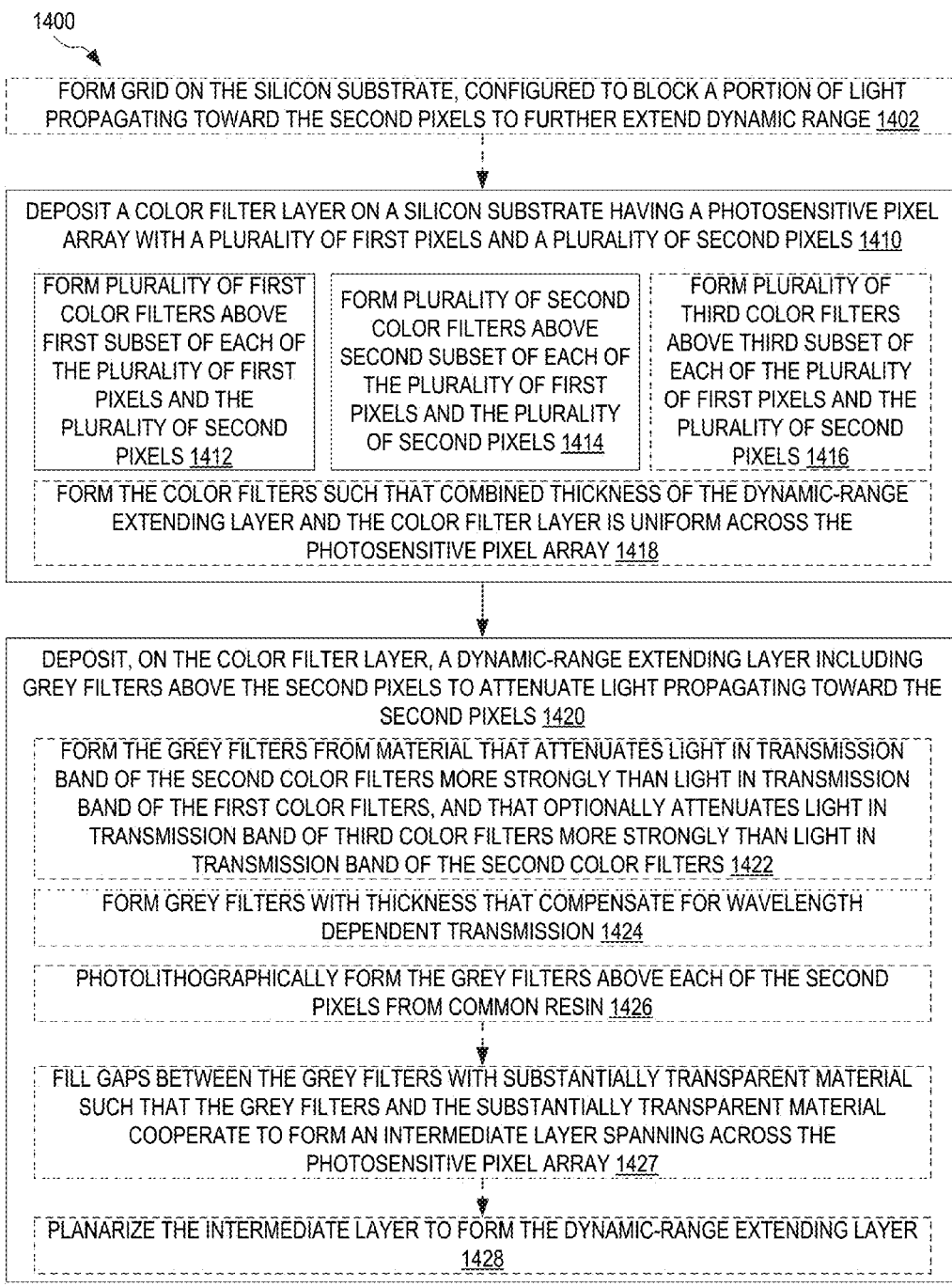
FIG. 14 illustrates a method for manufacturing an HDR color image sensor, according to an embodiment.

FIG. 14 illustrates one exemplary method 1400 for manufacturing an HDR color image sensor. Method 1400 is, for example, used to manufacture HDR color image sensor 100. Certain embodiments of method 1400 may be used to manufacture HDR color image sensor 800 with formation of grey filters 832 in a single photolithographic process step. FIGS. 15A-C and 16A-D illustrate, by example, certain steps of one embodiment of method 1400. FIGS. 14, 15A-C, and 16A-D are best viewed together.

A step 1410 deposits a color filter layer on a silicon substrate having a photosensitive pixel array with a plurality of first pixels and a plurality of second pixels. In one example, step 1410 deposits color filter layer 120 on light-receiving surface of silicon substrate 110. In another example, step 1410 deposits color filter layer 820 on silicon substrate 110. Step 1410 includes steps 1412 and 1414. Step 1412 forms a plurality of first color filters above a first subset of each of the plurality of first pixels and the plurality of second pixels. In one example, step 1412 forms color filters 124(1) on light-receiving surface 118 of silicon substrate 110 above a first subset of pixels 114 and above a first subset of pixels 116. In another example, step 1412 forms red color filters 824(1) on light-receiving surface 118 of silicon substrate 110 above a first subset of pixels 114 and above a first subset of pixels 116. Step 1414 forms a plurality of second color filters above a second subset of each of the plurality of first pixels and the plurality of second pixels. In one example, step 1414 forms color filters 124(2) on light-receiving surface 118 of silicon substrate 110 above a second subset of pixels 114 and above a second subset of pixels 116. In another example, step 1414 forms green color filters 824(2) on light-receiving surface 118 of silicon substrate 110 above a second subset of pixels 114 and above a second subset of pixels 116. Optionally, step 1410 further includes a step 1416 of forming a plurality of third color filters above a third subset of each of the plurality of first pixels and the plurality of second pixels. In one example, step 1416 forms color filters 124(3) on light-receiving surface 118 of silicon substrate 110 above a third subset of pixels 114 and above a third subset of pixels 116. In another example, step 1416 forms blue color filters 824(3) on light-receiving surface 118 of silicon substrate 110 above a third subset of pixels 114 and above a third subset of pixels 116.

Figure 15A:
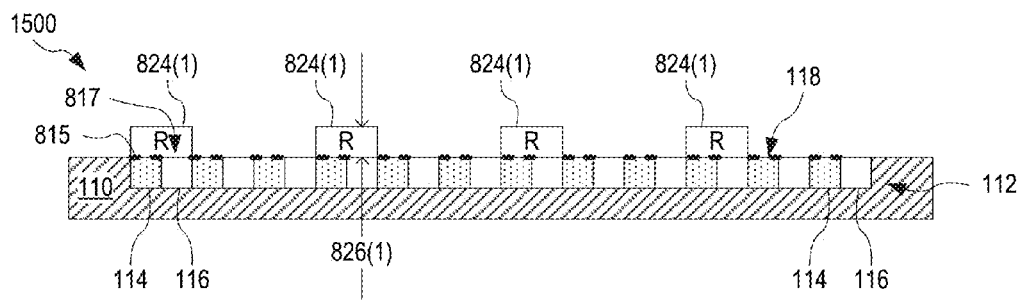
FIGS. 15A-C illustrate one example of a portion of the method of FIG. 14 used to form the color filter layer of the HDR color image sensor of FIG. 8.
Figure 15B:
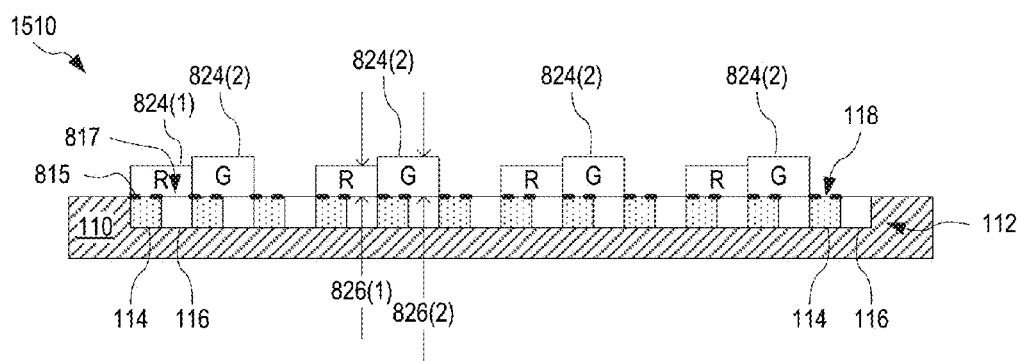
Figure 15C:
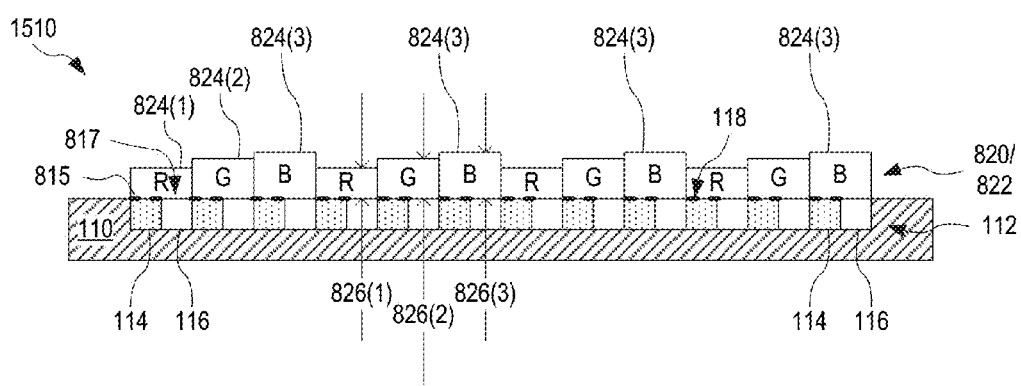

FIGS. 15A-C show one example of step 1410 related to formation of color filter layer 820, wherein color filters 824(1), 824(2), and 824(3) are sequentially formed on light-receiving surface 118 of silicon substrate 110. In a first sub-step, shown in FIG. 15A, red color filters 824(1) are photolithographically formed on light-receiving surface 118 of silicon substrate 110 above a first subset of pixels 114 and 116, for example using methods known in the art. In a second sub-step, shown in FIG. 15B, green color filters 824(2) are photolithographically formed on light-receiving surface above a second subset of pixels 114 and 116, for example using methods known in the art. In a third sub-step, shown in FIG. 15C, blue color filters 824(3) are photolithographically formed on light-receiving surface above a third subset of pixels 114 and 116, for example using methods known in the art. The sub-steps shown in FIGS. 15A-C are performed sequentially, as opposed to simultaneously, because different materials are used to form the three different types of color filters 824(1), 824(2), and 824(3). In order to avoid mixing of these different materials, excess color filter material are removed after formation of one type of color filters 824(1), 824(2), and 824(3) before proceeding to formation of the next type of color filters 824(1), 824(2), and 824(3). For example, the step illustrated in FIG. 15A includes (a) depositing, on light-receiving surface 118, photoresist that is specific to formation of red color filters 824(1), (b) developing the photoresist above certain pixels 114 and 116 to form red color filters 824(1) in the intended positions, (c) removing undeveloped photoresist from areas above other pixels 114 and 116, and optionally (d) baking the developed photoresist to complete curing of red color filters 824(1). These process steps are completed before proceeding to the process steps of FIG. 15B.

In certain embodiments, such as illustrated by example in FIGS. 15A-C, step 1410 implements a step 1418 of forming the color filters such that the combined thickness of the dynamic-range extending layer (formed in a subsequent step 1420) and the color filter layer is uniform across the photosensitive pixel array. In the example shown in FIGS. 15A-C, red color filters 824(1), green color filters 824(2), and blue color filters 824(3) are formed with different respective thicknesses 826(1), 826(2), and 826(3).

Without departing from the scope hereof, step 1410 may include one or more additional steps of depositing one or more additional types of color filters.

Optionally, step 1410 is preceded by a step 1402 of forming an aperture grid on the silicon substrate. This aperture grid is configured to block a portion of the light propagating toward the second pixels to further extend the dynamic range. In one example of step 1402, aperture grid 215, 315, or 815 is formed on light-receiving surface 118 of silicon substrate 110.

A step 1420 deposits, on the color filter layer formed in step 1410, a dynamic-range extending layer including grey filters above the second pixels to attenuate light propagating toward the second pixels. In one example, step 1420 deposits dynamic-range extending layer 130 on color filter layer 120. In another example, step 1420 deposits dynamic-range extending layer 830 on color filter layer 820. Step 1420 includes a step 1422 of forming the grey filters from a material that attenuates light in the transmission band of the second color filters more strongly than light in the transmission band of the first color filters. In embodiments of method 1400 that include both step 1416 and step 1422, the grey filters are formed from a material that attenuates light in the transmission band of the third color filters more strongly than light in the transmission band of the second color filters. In one example of step 1420 implementing step 1422, grey filters 132 or 832 are formed from a material having transmission properties similar to those shown in FIG. 6.

Embodiments of step 1420 that include step 1422 may also include a step 1424 of forming the grey filters with thicknesses that compensate for the wavelength dependent transmission of step 1422. In one example, step 1420 implements step 1422 and 1424 to form color filters 824(1), 824(2), and 824(3) having different respective thicknesses 826(1), 826(2), and 826(3) to compensate for the transmission coefficient being an increasing function of wavelength.

In an embodiment, step 1420 includes steps 1426, 1427, and 1428. Step 1420 may combine steps 1426, 1427, and 1428 with steps 1422 and 1424. Step 1426 photolithographically forms the grey filters above each of the second pixels from a common photoresistive resin. In one example, step 1426 photolithographically forms grey filters 132 on color filter layer 120. In another example, step 1426 photolithographically forms grey filters 832 on color filter layer 820. Step 1427 fills gaps between the grey filters, formed in step 1426, with a substantially transparent material such that the grey filters and the substantially transparent material cooperate to form an intermediate layer spanning across the photosensitive pixel array. In one example, step 1427 deposits a substantially transparent material on color filter layer 120 between grey filters 132, and optionally above at least some of grey filters 132, to form an intermediate layer spanning across photosensitive pixel array 112. In another example, step 1427 deposits a substantially transparent material on color filter layer 820 between grey filters 832, and optionally above at least some of grey filters 832, to form an intermediate layer spanning across photosensitive pixel array 112. Step 1428 planarizes the intermediate layer to form the dynamic-range extending layer. In one example, step 1428 planarizes the intermediate layer formed in step 1427 to form dynamic-range extending layer 130 above color filter layer 120. In another example, step 1428 planarizes the intermediate layer formed in step 1427 to form dynamic-range extending layer 830 above color filter layer 820.

FIGS. 16A-D show one example of step 1420 related to formation of dynamic-range extending layer 830, wherein grey filters 832 of different thicknesses 836(1), 836(2), and 836(3) are formed through a single photolithographic deposition step. Since the thickness of the underlying color filters 824(1), 824(2), and 824(3) have thicknesses 826(1), 826(2), and 826(3) configured to compensate for the different thicknesses 836(1), 836(2), and 836(3) of grey filters 832, this example of step 1420 may form grey filters 832 of different thicknesses 836(1), 836(2), and 836(3) using a single photolithographic deposition step, while achieving planar continuous surface 839 of the resulting dynamic-range extending layer 830 facing away from silicon substrate 110. Initially, in step 1426, all grey filters 832 are formed with substantially the same thickness. However, the planarization performed in step 1428 both (a) planarizes dynamic-range extending layer 830 and (b) modifies the thicknesses of grey filters 832 to the final thicknesses 836(1), 836(2), and 836(3). Thus, proper design of thicknesses 826(1), 826(2), and 826(3) of respective color filters 824(1), 824(2), and 824(3) deposited in step 1410 cooperate with the planarization in step 1428 to enable formation of grey filters 832 with different thicknesses 836(1), 836(2), and 836(3) through a single photolithography process in step 1426. This is possible, because dynamic-range extending layer 830 is formed after and on top of color filter layer 820, as opposed to before and below color filter layer 820.

Figure 16A:
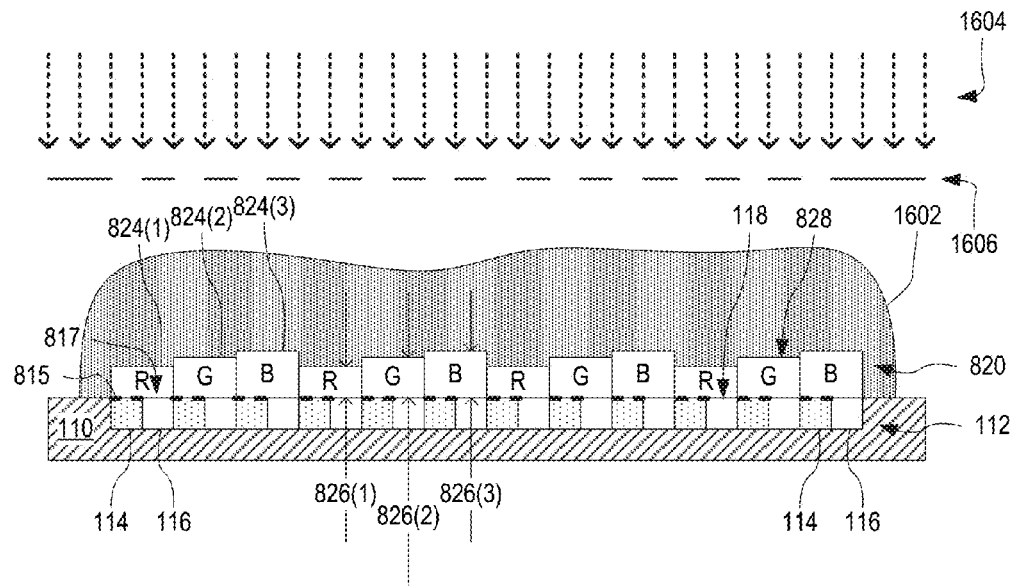
FIGS. 16A-D illustrate one example of a portion of the method of FIG. 14 used to form the dynamic-range extending layer of the HDR color image sensor of FIG. 8.
Figure 16B:
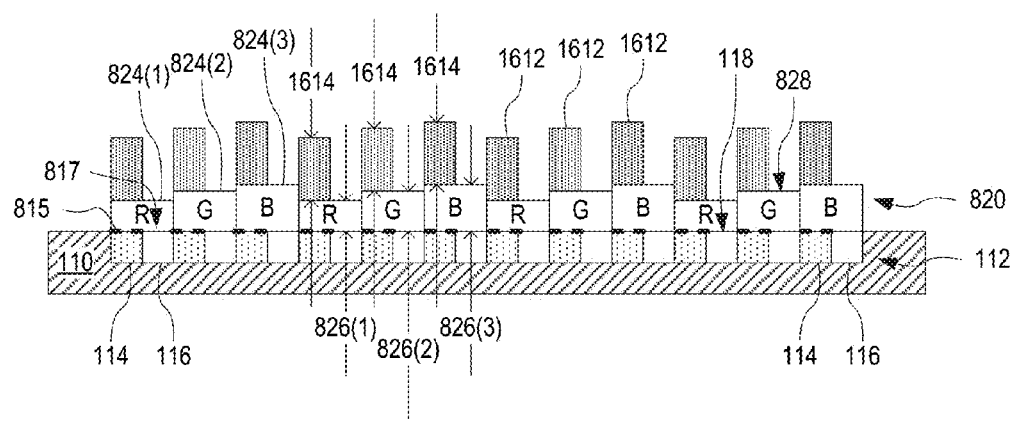

FIGS. 16A and 16B illustrate one example of step 1426. As shown in FIG. 16A, photoresistive resin 1602 is deposited on color filter layer 820, optionally extending beyond color filter layer 820 to exposed surfaces of silicon substrate 110. Photoresistive resin 1602 is exposed to light 1604 through a mask 1606 (see FIG. 16A) to develop pillars 1612 of grey material (see FIG. 16B) on color filter layer 820 above each pixel 114. Without departing from the scope hereof, step 1426 may use negative or positive photoresist.

Since each pillar 1612 is formed from exposure to substantially the same amount of light 1604, each pillar 1612 has substantially the same thickness 1614.

Figure 16C:
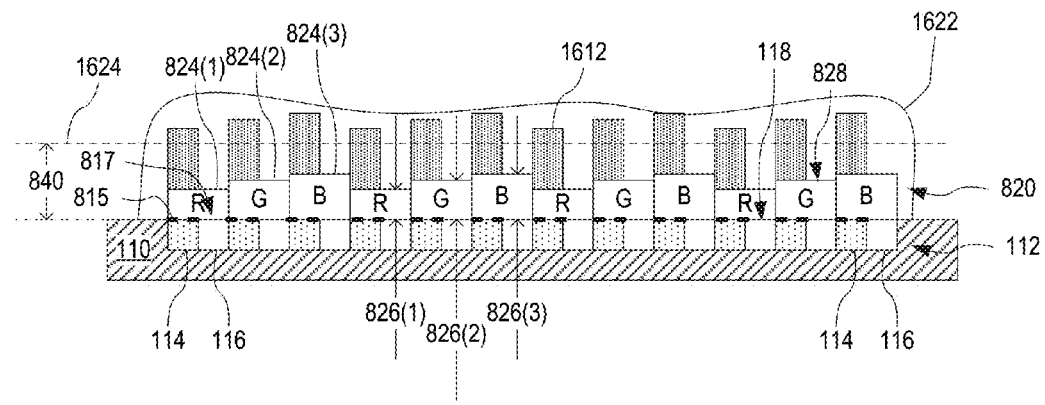
Figure 16D:
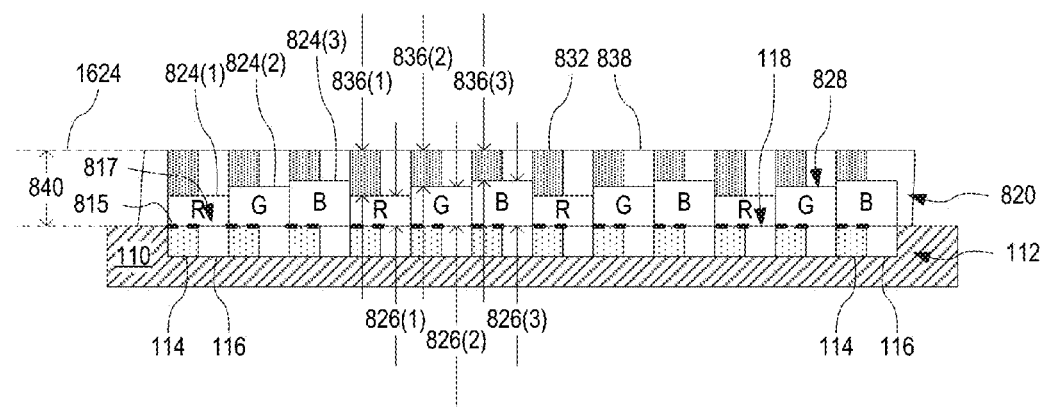

FIGS. 16C and 16D show one example of steps 1427 and 1428. In this example, step 1427 deposits a substantially transparent material 1622 over pillars 1612 to fill gaps between pillars 1612 (see FIG. 16C), and step 1428 planarizes material 1622 and pillars 1612 at a plane 1624 (see FIG. 16C) located at distance 840 above light-receiving surface 118. The outcome of step 1428, as shown in FIG. 16D, according to the example shown in FIG. 16C, is an embodiment of HDR color image sensor 800 including material 838.

Although not shown in FIGS. 14-16C, method 1400 may include a step of forming microlens array 140 on dynamic-range extending layer 130 or 830. Without departing from the scope hereof, substantially transparent material 1622 may be replaced by a material that is not transparent but still is more light transmissive than grey filters 132 or 832. Also without departing from the scope hereof, method 1400 may be performed at the wafer-level, to manufacture a plurality (for example hundreds or thousands) of HDR color image sensor 100 or 800 in parallel. Method 1400 is readily extendable to other color filter schemes, such as those discussed above in reference to FIG. 1, and may be applied to a variety of pixel configurations, such as those discussed above in reference to FIGS. 1, 2A, 2B, 3A, and 3B.

Combinations of Features

Features described above as well as those claimed below may be combined in various ways without departing from the scope hereof. For example, it will be appreciated that aspects of one HDR color image sensor, or associated system or method, described herein may incorporate or swap features of another HDR color image sensor, or associated system or method, described herein. The following examples illustrate possible, non-limiting combinations of embodiments described above. It should be clear that many other changes and modifications may be made to the methods and device herein without departing from the spirit and scope of this invention:

(A1) A high-dynamic-range color image sensor may include (a) a silicon substrate including a photosensitive pixel array with a plurality of first pixels and a plurality of second pixels, (b) a color filter layer disposed on the silicon substrate and including at least (i) a plurality of first color filters positioned above a first subset of each of the plurality of first pixels and the plurality of second pixels and configured to selectively transmit light of a first color range and (ii) a plurality of second color filters positioned above a second subset of each of the plurality of first pixels and the plurality of second pixels and configured to selectively transmit light of a second color range, and (c) a dynamic-range extending layer disposed on the color filter layer and including grey filters disposed above the second plurality of pixels to attenuate light propagating toward the second plurality of pixels.

(A2) In the high-dynamic-range color image sensor denoted as (A1), the first subset may have no overlap with the second subset.

(A3) In either of both of the high-dynamic-range color image sensors denoted as (A1) and (A2), the first pixels may form a high-sensitivity pixel array for cooperating with the color filter layer to capture a high-sensitivity image of a scene, and the second pixels may cooperate with the grey filters to form a low-sensitivity pixel array, interleaved in the high-sensitivity pixel array, for cooperating with the color filter layer to capture a low-sensitivity image of a scene.

(A4) In any of the high-dynamic-range color image sensors denoted as (A1) through (A3), the first color filters may be arranged in a plurality of first segments, the second color filters may be arranged in a plurality of second segments, each of the first segments may be positioned above a respective one of the first pixels and an adjacent respective one of the second pixels, and each of the second segments may be positioned above another respective one of the first pixels and another adjacent respective one of the second pixels.

(A5) In any of the high-dynamic range color image sensors denoted as (A1) through (A4), the thickness of the grey filters above the second color filters may be less than the thickness of the grey filters above the first color filters to compensate for attenuation of material of the grey filters being greater in the second color range than in the first color range.

(A6) In the high-dynamic-range color image sensor denoted as (A5), the combined thickness of the color filter layer and the dynamic-range extending layer may be uniform across the photosensitive pixel array.

(A7) In either or both of the high-dynamic-range color image sensors denoted as (A5) and (A6), the dynamic-range-extending layer may include a substantially transparent material above each of the first pixels.

(A8) In any of the high-dynamic-range color image sensors denoted as (A5) through (A7), the color filter layer may further include a plurality of third color filters positioned above a third subset of each of the plurality of first pixels and the plurality of second pixels and configured to selectively transmit light of a third color range, wherein the thickness of the grey filters above the third color filters is less than the thickness of the grey filters above the second color filters to compensate for attenuation of material of the grey filters being greater in the third color range than in the second color range.

(A9) In the high-dynamic-range color image sensor denoted as (A8), the first color range may include a red portion of visible spectrum, the second color range may include a green portion of the visible spectrum, and the third color range may include a blue portion of the visible spectrum.

(A10) In either or both of the high-dynamic-range color image sensors denoted as (A8) and (A9), light transmission through the color filter layer and the dynamic-range extending layer to the second pixels may have a first peak value for the first color filters, a second peak value for the second color filters, and a third peak value for the third color filters, wherein each of the first peak value, the second peak value, and the third peak value is at least 60% of maximum of the first peak value, the second peak value, and the third peak value.

(A11) In any of the high-dynamic-range color image sensors denoted as (A8) through (A10), the thickness of the first color filters may be in the range between 0.65 and 0.75 microns, the thickness of the second color filters may be in the range between 0.75 and 0.85 microns, the thickness of the third color filters may be in the range between 0.85 and 0.95 microns, the thickness of the grey filters may be in the range between 0.3 and 0.8 microns, and the combined thickness of the color filter layer and the dynamic-range extending layer may be uniform across the photosensitive pixel array.

(A12) In any of the high-dynamic-range color image sensors denoted as (A1) through (A12), the first pixels may have larger transverse dimensions than the second pixels to further extend dynamic range.

(A13) Any of the high-dynamic-range color image sensors denoted as (A1) through (A12) may further include a metal grid, disposed on the silicon substrate, for blocking a portion of light propagating toward the second pixels to further extend dynamic range.

(B1) A method for manufacturing a high-dynamic-range color image sensor may include (a) depositing a color filter layer on a silicon substrate having a photosensitive pixel array with a plurality of first pixels and a plurality of second pixels, wherein said depositing includes forming at least (i) a plurality of first color filters above a first subset of each of the plurality of first pixels and the plurality of second pixels and (ii) a plurality of second color filters above a second subset of each of the plurality of first pixels and the plurality of second pixels, and wherein the thickness of the second color filters exceeds the thickness of the first color filters, and (b) depositing, on the color filter layer, a dynamic-range extending layer including grey filters above the second pixels to attenuate light propagating toward the second pixels, wherein the combined thickness of the color filter layer and the dynamic-range extending layer is uniform across the photosensitive pixel array such that the thickness of the grey filters above the second color filters is less than thickness of the grey filters above the first color filters to compensate for attenuation of material of the grey filters being greater in transmission band of the second color filters than in transmission band of the first color filters.

(B2) In the method denoted as (B1), the first subset may have no overlap with the second subset.

(B3) In either or both of the methods denoted as (B1) and (B2), the step of depositing the dynamic-range extending layer may include (A) photolithographically forming the grey filters above each of the second pixels from common resin, (B) filling gaps between the grey filters with substantially transparent material such that the grey filters and the substantially transparent material cooperate to form an intermediate layer spanning across the photosensitive pixel array, and (C) planarizing the intermediate layer to form the dynamic-range extending layer.

(B4) In the method denoted as (B3), the step of photolithographically forming the grey filters may include forming the grey filters to a first thickness that is substantially the same above all of the small pixels prior to said planarizing.

(B5) In either or both of the methods denoted as (B1) through (B4), the step of depositing the color filter layer may include forming the second color filters with thickness at least 0.1 micron greater than thickness of the first color filters.

(B6) Any of the methods denoted as (B1) through (B5) may further include (1) in the step of depositing the color filter layer, forming a plurality of third color filters above a third subset of the photosensitive pixel array including a third subset of each of the first and second pixels, wherein the thickness of the third color filters exceeds the thickness of the second color filters, and (2) in the step of depositing the dynamic-range extending layer, forming grey filters above second pixels located under the third color filters such that the thickness of the grey filters above the third color filters is less than the thickness of the grey filters above the second color filters to compensate for attenuation of material of the grey filters being greater in transmission band of the third color filters than in transmission band of the second color filters.

(B7) Any of the methods denoted as (B1) through (B6) may further include forming a grid on the silicon substrate, wherein the grid is configured to block a portion of light propagating toward the second pixels to further extend dynamic range.

(B8) In any of the methods denoted as (B1) through (B7), the second pixels may be smaller than the first pixels to further extend the dynamic range.

(C1) A method for generating high-dynamic-range images may include (a) partly absorbing first light propagating from a scene toward a plurality of first pixels of a photosensitive pixel array to attenuate the first light as compared to second light propagating from the scene toward a plurality of second pixels of the photosensitive pixel array, wherein the plurality of second pixels is interleaved with the plurality of first pixels, and (b) after the step of partly absorbing, spectrally filtering the first light to form an attenuated color image of the scene on the photosensitive pixel array at the first pixels and spectrally filtering the second light to form a brighter color image of the scene on the photosensitive pixel array at the second pixels.

(C2) In the method denoted as (C1), the step of partly absorbing may include partly absorbing a plurality of color components in same type of grey material, wherein the thickness of the grey material is different for each of the color components to compensate for wavelength dependent transmission of the material.

(C3) In the method denoted as (C2), the step of spectrally filtering may include selectively transmitting each of the color components, to respective subsets of each of the plurality of first pixels and the plurality of second pixels, through respective colors filter having thicknesses that cooperate with corresponding thicknesses of the grey material to ensure uniform combined thickness of the color filters and the grey material across the photosensitive pixel array.

(C4) Any of the methods denoted as (C1) through (C3) may further include further attenuating the attenuated color image by geometrically restricting the active area of each of the first pixels, as compared to the second pixels.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and systems, which, as a matter of language, might be said to fall therebetween.

What is claimed is:

1. A high-dynamic-range color image sensor, comprising:
   a silicon substrate including a photosensitive pixel array with first pixels and second pixels;
   a color filter layer disposed on the silicon substrate and including first color filters configured to selectively transmit light of a first color range and second color filters configured to selectively transmit light of a second color range, each of the first color filters characterized by a first thickness, each of the second color filters characterized by a second thickness that is greater than the first thickness; and
   a dynamic-range extending layer disposed on the color filter layer and including (a) grey filters configured to attenuate light and (b) material portions that are more light transmitting than the grey filters;
   the first pixels, the second pixels, the first color filters, the second color filters, the grey filters, and the material portions being arranged in a plurality of first pixel groups and a plurality of second pixels groups, each of the first pixel groups including:

(a) a respective one of the first pixels and an adjacent respective one of the second pixels,
(b) a respective one of the first color filters situated on top of the respective one of the first pixels and the respective one of the second pixels,
(c) a respective one of the material portions situated on top of the respective one of the first color filters above the respective one of the first pixels, and
(d) adjacent the respective one of the material portions, a respective one of the grey filters characterized by a third thickness and situated on top of the respective one of the first color filters above the respective one of the second pixels, each of the second pixels groups including:
(a) a respective one of the first pixels and an adjacent respective one of the second pixels,
(b) a respective one of the second color filters situated on top of the respective one of the first pixels and the respective one of the second pixels,
(c) a respective one of the material portions situated on top of the respective one of the second color filters above the respective one of the first pixels, and
(d) adjacent the respective one of the material portions, a respective one of the grey filters characterized by a fourth thickness and situated on top of the respective one of the second color filters above the respective one of the second pixels, the fourth thickness being less than the third thickness.

2. The high-dynamic-range color image sensor of claim 1, the plurality of first pixel groups having no overlap with the plurality of second pixel groups.

3. The high-dynamic-range color image sensor of claim 1, the first pixels and the material portions together forming a high-sensitivity pixel array for cooperating with the color filter layer to capture a high-sensitivity image of a scene, the second pixels and the grey filters together forming a low-sensitivity pixel array, interleaved in the high-sensitivity pixel array, for cooperating with the color filter layer to capture a low-sensitivity image of a scene.

4. The high-dynamic-range color image sensor of claim 1, within each of the first pixel groups, thickness of the respective one of the material portions being equal to the third thickness, and within each of the second pixel groups, thickness of the respective one of the material portions being equal to the fourth thickness.

5. The high-dynamic range color image sensor of claim 1, the grey filters composed of material having greater transmission coefficient in the first color range than in the second color range, difference between the third thickness and the fourth thickness configured to compensate for the greater transmission coefficient of the material of the grey filters in the first color range than in the second color range.

6. The high-dynamic-range color image sensor of claim 1, sum of the first thickness and the third thickness being equal to sum of the second thickness and the fourth thickness.

7. The high-dynamic-range color image sensor of claim 1, the material portions being substantially transparent.

8. The high-dynamic-range color image sensor of claim 6, wherein
the silicon substrate further includes additional instances of the first pixels and additional instances of the second pixels;
the color filter layer further includes third color filters configured to selectively transmit light of a third color range, each of the third color filters being characterized by a fifth thickness that is greater than the second thickness; and
the dynamic-range extending layer further includes additional instances of the grey filters and the material portions;
the third color filters and the additional instances of each of the first pixels, the second pixels, the grey filters, and the material portions being arranged in a plurality of third pixels groups that each includes:
(a) a respective one of the additional instances of the first pixels and an adjacent respective one of the additional instances of the second pixels,
(b) a respective one of the third color filters situated on top of the respective one of the additional instances of the first pixels and the respective one of the additional instances of the second pixels,
(c) a respective one of the additional instances of the material portions situated on top of the respective one of the third color filters above the respective one of the additional instances of the first pixels, and
(d) adjacent the respective one of the additional instances of the material portions, a respective one of the additional instances of the grey filters characterized by a sixth thickness and situated on top of the respective one of the third color filters above the respective one of the additional instances of the second pixels, the sixth thickness being less than the fourth thickness, sum of the fifth thickness and the sixth thickness being equal to sum of the first thickness and the third thickness.

9. The high-dynamic-range color image sensor of claim 8, the first color range including red portion of visible spectrum, the second color range including green portion of the visible spectrum, and the third color range including blue portion of the visible spectrum.

10. The high-dynamic-range color image sensor of claim 9, light transmission through the color filter layer and the dynamic-range extending layer to each of the second pixels having a first peak value for the first color filters, a second peak value for the second color filters, and a third peak value for the third color filters, each of the first peak value, the second peak value, and the third peak value being at least 60% of maximum of the first peak value, the second peak value, and the third peak value.

11. The high-dynamic-range color image sensor of claim 9, thickness of each of the first color filters being in range between 0.65 and 0.75 microns, thickness of each of the second color filters being in range between 0.75 and 0.85 microns, thickness of each of the third color filters being in range between 0.85 and 0.95 microns, thickness of each of the grey filters being in range between 0.3 and 0.8 microns, and combined thickness of the color filter layer and the dynamic-range extending layer being uniform across the photosensitive pixel array.

12. The high-dynamic-range color image sensor of claim 1, each of the first pixels having larger transverse dimensions than each of the second pixels to further extend dynamic range.

13. The high-dynamic-range color image sensor of claim 1, further comprising a metal grid, disposed on the silicon substrate, for blocking a portion of light propagating toward the second pixels to further extend dynamic range.

* * * * *